United States Patent [19]
Hsieh et al.

[11] Patent Number: 5,945,502
[45] Date of Patent: Aug. 31, 1999

[54] ELECTROLUMINESCENT POLYMER COMPOSITIONS AND PROCESSES THEREOF

[75] Inventors: Bing R. Hsieh; Yuan Yu, both of Webster, N.Y.

[73] Assignee: Xerox Corporation, Stamford, Conn.

[21] Appl. No.: 08/969,825

[22] Filed: Nov. 13, 1997

[51] Int. Cl.$^6$ .................................................. C08G 59/00
[52] U.S. Cl. ........................ 528/101; 430/321; 528/104; 528/205; 528/377; 528/392; 528/43
[58] Field of Search ............................ 430/321; 528/101, 528/104, 205, 377, 392, 43

[56] References Cited

U.S. PATENT DOCUMENTS

| | | | |
|---|---|---|---|
| 5,247,190 | 9/1993 | Friend et al. | 257/40 |
| 5,317,169 | 5/1994 | Nakano et al. | 257/40 |
| 5,514,878 | 5/1996 | Holmes et al. | 257/40 |
| 5,543,079 | 8/1996 | Ohnishi et al. | 252/301.35 |
| 5,589,320 | 12/1996 | Ohnishi et al. | 430/321 |

*Primary Examiner*—Melvyn I. Marquis
*Attorney, Agent, or Firm*—John L. Haack

[57] ABSTRACT

A polymer including mers of the formulas:

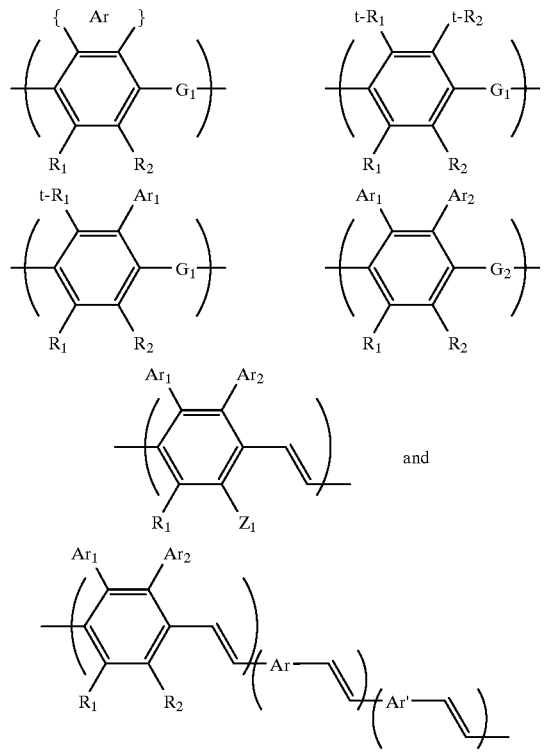

and copolymers or mixtures thereof.

20 Claims, No Drawings

ELECTROLUMINESCENT POLYMER COMPOSITIONS AND PROCESSES THEREOF

CROSS REFERENCE TO COPENDING APPLICATIONS AND PATENTS

Reference is made to commonly assigned copending applications: U.S. Ser. No. 08/707,162, filed Sep. 3, 1996 entitled "ELECTROLUMINESENT DEVICES"; U.S. Ser. No. 08/707,260, filed Sep. 3, 1996, entitled "ELECTROLUMINESENCT DEVICES"; U.S. Ser. No. 08/751,530, filed Nov. 13, 1996, now U.S. Pat. No. 5,753,757, entitled "ELECTROLUMINESCENT POLYMER COMPOSITIONS AND PROCESSES THEREOF"; U.S. Ser. No. 08/751,532, filed Nov. 13, 1996, now U.S. Pat. No. 5,817,430, entitled "ELECTROLUMINESCENT POLYMER COMPOSITIONS AND PROCESSES THEREOF"; U.S. Ser. No. 08/950,303, filed Oct. 14, 1997, now U.S. Pat. No. 5,853,906, entitled "CONDUCTIVE POLYMER COATINGS AND PROCESSES THEREOF"; U.S. Ser. No. 08/950,300, filed Oct. 14, 1997, entitled "CONDUCTIVE POLYMER COATINGS AND PROCESSES THEREOF"; U.S. Ser. No. 08/969,727, filed Nov. 13, 1997, entitled "ELECTROLUMINESCENT POLYMER COMPOSITIONS AND PROCESSES THEREOF"; and U.S. Ser. No. 08/942,598, filed Oct. 2, 1997, entitled "NOVEL HOLE TRANSPORT MATERIALS AND ORGANIC ELECTROLUMINESCENT DEVICES THEREOF".

U.S. Pat. No. 5,558,904, issued Sep. 24, 1996, entitled "ELECTROLUMINESCENT DEVICES CONTAINING A CONJUGATED POLYMER OBTAINED VIA HALOGEN PRECURSOR ROUTE CHEMISTRY" and U.S. Pat. No. 5,674,635, issued Oct. 7, 1997, entitled "ELECTROLUMINESCENT DEVICE", which discloses an electroluminescent (EL) device including a polymeric tetraaryl-substituted biphenyldiamine.

The disclosures of each of the aforementioned copending applications and patents are totally incorporated herein by reference. The appropriate components and processes of these patents and copending applications may be selected for the compositions, EL devices, and processes of the present invention in embodiments thereof.

BACKGROUND OF THE INVENTION

The present invention relates to electroluminescent polymer compositions and processes for the preparation and use thereof in, for example, electroluminescent devices such as electroluminescent displays and electrochemical cells. More particularly, the invention relates to polymer compositions and to processes for making and using in, for example, high performance, that is, high stability and high luminosity electroluminescent displays and devices.

The present invention, in embodiments, is directed to processes for preparing soluble polymers, especially conjugated polymers, wherein at least one solubilizing side chain or substitutent which is present in the monomer imparts desirable solubility and processibility properties to the resulting polymer product.

Conjugated polymers are an important class of light emitting polymers for electroluminescent (EL) devices. There are two principal approaches to the fabrication of conjugated polymer thin films, namely, the precursor approach and side chain approach. The former relies on the preparation of a soluble precursor polymer which can be cast into thin films. The precursor polymer can then be converted to the final conjugated polymer films through solid-state thermo- or photo-conversion. Friend et al., disclosed EL devices based on poly(p-phenylene vinylene) (PPV) thin films derived from a sulfonium precursor route, reference U.S. Pat. No. 5,247,190. Hsieh et al., disclosed similar PPV EL devices using halogen precursor routes as disclosed in the aforementioned commonly owned U.S. Pat. No. 5,558,904. Son et al., reported PPV based EL devices using a xanthate precursor route in Science, 1995, 269, 376–380. There are several problems associated with the precursor approach. First, the precursor polymers derived from these precursor routes have unsatisfactory molecular structures because they are typically random copolymers containing 5–50% of converted segments. Second, expensive and potentially environmentally harmful photo- or thermo-conversion is required. Third, the presence of structural defects arising from incomplete thermoconversion and side reactions with volatile organic species generated during the thermal conversion. These aspects can lead to poor device properties and poor manufacture reproducibility.

The side chain approach of the present invention involves the formation of polymers by the polymerization of a monomer containing soluble substituents or side groups to afford a soluble conjugated polymer that can be cast into thin film directly without conversion. The polymerization of bis(halomethyl)benzenes in the presence of large excess base to provide PPV products was first reported by Gilch et al., in *Journal of Polymer Science*: Part A-1, 4:1337 (1966). In principle, the adaptation of the Gilch route to the polymerization of a 1,4-bis(halomethyl)benzene containing solubilizing groups should give a soluble PPV derivative. Unfortunately, this is not the situation in practice primarily because of polymer product precipitation during polymerization. The precipitation may be caused by the high molecular weight, semicrystallinity and/or cross-linking of the product. As a result, the desired soluble product has been obtained in very low yields (<10%). The Gilch route is disadvantaged in that is lacks sufficient control over molecular weight of the polymer. Another problem of the Gilch route is the lack of control over polymer chain ends and polymer architecture. These problems to have been effectively solved by the use of non-polymerizing acidic additives as disclosed in the aforementioned copending U.S. Ser. No. 08/751,532, filed Nov. 13, 1996, now U.S. Pat. No. 5,817,430.

Conjugated polymers, such as poly(p-phenylene vinylenes), and electron acceptors, such as Buchminsterfullerenes C60, can be fabricated into heterojunction diodes for use in photodiodes and photovoltaic cells, reference for example, U.S. Pat. Nos. 5,454,880 and 5,331,183 both issued to Sariciffci, et. al. U.S. Pat. No. 5,401,827, issued Mar. 28, 1995, to Holmes et al., discloses various semiconductive conjugated copolymers containing arylene vinylene segments converted from sulfonium precursor polymers. The bandgap and refractive index of the conjugated copolymer were controlled by the degree of conversion. The patterning of such conjugated copolymers for device application was disclosed in U.S. Pat. No. 5,328,809, their application in luminescent devices was disclosed in U.S. Pat. No. 5,512,654, and their application in optical devices was disclosed in U.S. Pat. Nos. 5,425,125 and 5,523,555. U.S. Pat. No. 5,653,914, issued Aug. 5, 1997, to Holmes et al., discloses a processible polymer matrix such as polymethylmethacryate and a chromophoric component such as stilbene or distyrylbenzene for electroluminescent device application. The chromophoric components are blended into the polymer matrix or covalently attached thereto as a side group. U.S. Pat. Nos. 5,597,890 and 5,599,899, issued Jan.

28, 1997 and Feb. 4, 1997, to Jenekhe, disclose heterocyclic rigid rod and ladder polymers for electroluminescent device applications. Since the polymers were not soluble in organic solvents, they required dissolution in acid for film deposition, followed by water washing to remove residual acid. This acid processing scheme is complex, expensive, poor in reproducibility, and produces hazardous waste streams.

PRIOR ART

U.S. Pat. No. 5,247,190, issued Sep. 21, 1993, to Friend et al., discloses an electroluminescent device comprising a semiconductor layer in the form of a thin dense polymer film comprising at least one conjugated polymer, a first contact layer in contact with a first surface of the semiconductor layer, and a second contact layer in contact with a second surface of the semiconductor layer. The polymer film of the semiconductor layer has a sufficiently low concentration of extrinsic charge carriers that on applying an electric field between the first and second contact layers across the semiconductor layer so as to render the second contact layer positive relative to the first contact layer charge carriers are injected into the semiconductor layer and radiation is emitted from the semiconductor layer. The polymer film can be poly(p-phenylenevinylene) wherein the phenylene ring may optionally carry one or more substituents each independently selected from alkyl, alkoxy, halogen or nitro.

U.S. Pat. No. 5,317,169, issued May 31, 1994, to Nakano et al., discloses polymers of the formula of —[Ar—B]—, where in Ar is an aromatic group and B is a vinylene or NH group, for electroluminescence device application.

U.S. Pat. No. 5,543,079, issued Aug. 6, 1996, to Ohnishi et al., discloses soluble fluorescent terpolymers of the formula of —[Ar'—CH=CH]—[Ar"—CH=CH]—[Ar'''—CH=CH]—, where in Ar', Ar", and Ar''' are different aromatic groups. The application of such polymers in luminescent devices was disclosed in U.S. Pat. No. 5,589,320.

U.S. Pat. No. 5,514,878, issued Mar. 28, 1995, to Holmes et al., discloses soluble semiconductive conjugated polymers incorporating electron-withdrawing groups for use in electroluminescent devices. The polymers have the general structure of [Ar—CX=CH—Ar'—CH=CX], wherein Ar and Ar' are aromatic groups and X is the electron-withdrawing group.

The disclosure of the aforementioned patents are totally incorporated herein by reference.

There continues to be a need for: easily accessible and processible semiconductive polymers that contain solubilizing side chain substituents for solvent processing; semiconductive polymers that contain ionizable groups to impart ionic conductivity to lower the device operation voltages and thus to increase the device stability; conjugated polymers that contain pendant chromophores; semiconductive polymers that can be used to fabricate multilayer structures via layer-by-layer molecular-level self-assembling schemes involving consecutive adsorption of polymers containing polyanions and polycations onto substrate surfaces from an aqueous phase or organic phase, for example, as disclosed in *Science*, 1997, 277, 1232–1237, and *Journal of Applied Physics*, 1996, 80(7), 4067–4071; semiconductive conjugated polymers that emit blue color light; and semiconductive polymers for applications in organic semiconductor devices such as light-emitting diodes, thin film transistors, photodetectors, electrochemical cells, light-emitting electrochemical cells, solar cells, and the like devices.

These needs and others solutions to the aforementioned problems are provided for in embodiments of the present invention and as illustrated herein.

SUMMARY OF THE INVENTION

Embodiments of the present invention, include:

overcoming, or minimizing deficiencies of prior art compositions and processes by providing compositions with improved conductivity and stability properties;

providing polymers that include or contain mers, that is, contiguous monomeric constituents selected from the formulas

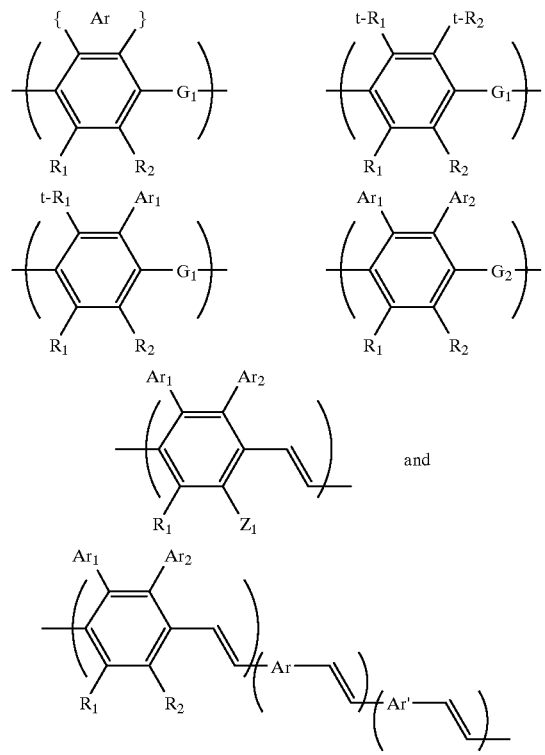

and copolymer or mixtures thereof;

providing polymer processes and compositions which are suitable for use in organic semiconductor device fabrication and application including light-emitting diodes, thin film transistors, photodetectors, electrochemical cells, light-emitting electrochemical cells, and solar cells; and providing semiconductive conjugated polymer compositions that are soluble in organic solvents, aqueous solvents, and mixtures thereof, and which solutions can be conveniently deposited as thin films by, for example, conventional spin coating methods.

DETAILED DESCRIPTION OF THE INVENTION

The present invention provides semiconductive conjugated polymer and copolymer compositions which are electrically and mechanically stable, and which polymers are useful, for example, in a variety of light-emitting devices and photoactive cells. In embodiments, the present invention provides polymers and copolymers comprised of mers, that is molecular subunits or monomer structural units, and mer combinations, for example, of the formulas

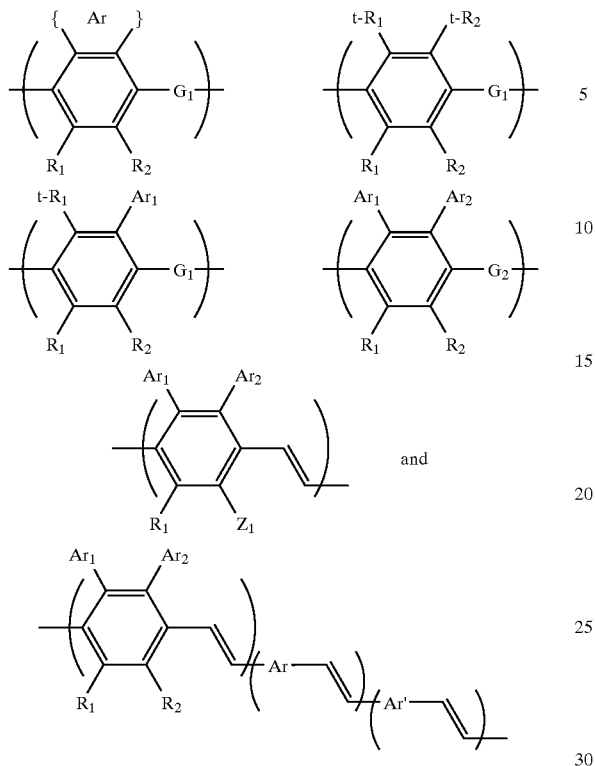

and mixtures thereof, wherein the latter formula represents a terpolymer comprised of three different mers as illustrated herein, wherein $t\text{-}R_1$ and $t\text{-}R_2$ are tertiary and secondary alkyl groups with from 4 to about 24 carbon atoms; {Ar} a is fused ring containing an aromatic or heteroaromatic group; $Ar_1$ and $Ar_2$ are substituted with, for example, alkyl groups with from 1 to about 24 carbon atoms, alkoxy groups with from 1 to about 24 carbon atoms, halogen atoms, such as F, Br, Cl and I, alkylthiol groups with from 1 to about 24 carbon atoms, cyano groups, perfluoroaklylated groups with from 1 to about 24 carbon atoms, phenoxylated groups, phenylthiolated groups, and the like groups, or unsubstituted aromatic groups with from about 6 to about 40 carbon atoms; Ar and Ar' are connecting divalent aromatic groups; $G_1$ and $G_2$ are independently selected from dicarbonyl groups, diimide groups, diether groups, and unsaturated groups, and $G_2$ is other than a vinylene group; $R_1$ and $R_2$ are independently selected from hydrogen, linear or branched alkyl groups with 1 to about 24 carbon atoms, alkylthio groups with 1 to about 24 carbon atoms, alkoxy groups with 1 to about 24 carbon atoms, alkylthio groups with 1 to about 24 carbon atoms, alkylseleno groups with 1 to about 24 carbon atoms, phenoxy groups, phenylthio groups, fluoroalkyl groups with 1 to about 24 carbon atoms, siloxane groups, silane groups, alkylated phenyl groups, alkoxylated phenyl groups, for example, containing from about 7 to about 24 carbon atoms, color dye containing groups, ionic groups, ion binding groups, where at least one of $R_1$ and $R_2$ are other than hydrogen; and $Z_1$ is selected from silicone groups, ionic groups, and color dye containing groups. The groups, $t\text{-}R_1$ and $t\text{-}R_2$, can be tertiary alkyls, for example, t-butyl, t-octyl, 1-adamantyl, 1-bicyclo(2,2,2)octyl, and the like tertial groups, and the corresponding secondary alkyls, and mixtures thereof. The fused ring group, {Ar}, can be for example, of the formulas:

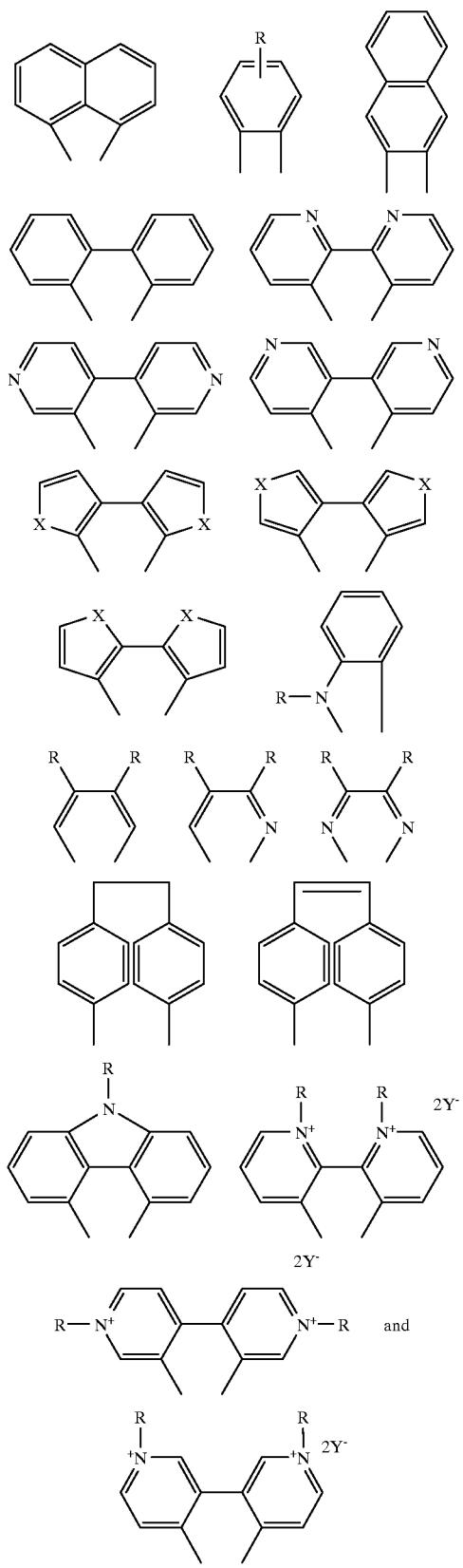

wherein X is O, S or NR' where R' is hydrogen, or an alkyl group with from 1 to about 24 carbon atoms, R is an alkyl group with 1 to about 24 carbon atoms, and $Y^-$ is a monovalent anion of the group $Cl^-$, $Br^-$, $CF_3COO-$, $BF_4^-$, $PF_6^-$, $AsF_6^-$, and $SbF_6^-$. In embodiments of the present invention, there are provided: homopolymers comprised of from about 10 to about 20,000, of one of the aforementioned mers; copolymers comprised of from about 0 to about 20,000, of two or more of the aforementioned mers; and includes terpolymers comprised of three different of the aforementioned mers; and mixtures thereof. In an embodiment, the terpolymer can comprise the aforementioned terpolymeric grouping, wherein the respective mers are present, for example, in relative mole ratios of about equal amounts to about 50:25:25. The copolymers and terpolymers can be, for example, random or block types.

The aforementioned connecting divalent aromatic groups, Ar and Ar', can be independently, for example, of the formulas:

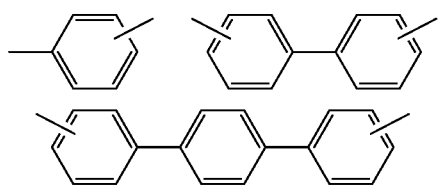

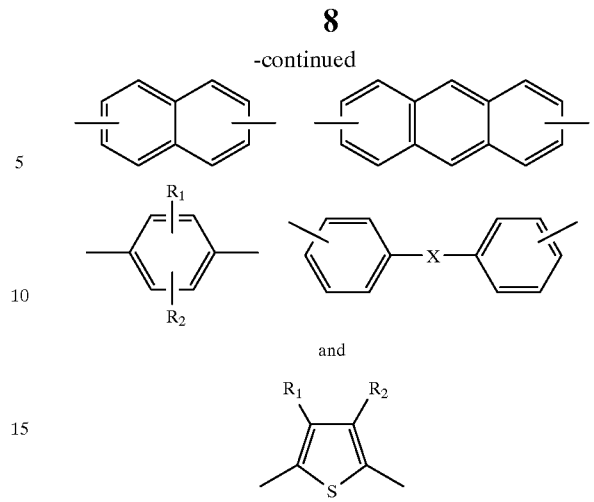

wherein $R_1$ and $R_2$ are alkyl groups with from 1 to about 24 carbon atoms, alkoxy groups with from 1 to about 24 carbon atoms, or aromatic groups with from 6 to about 24 carbon atoms, and X is O, S, or an alkylene group with from 1 to about 24 carbon atoms. The dicarbonyl groups can be independently, for example, diesters, diamides, diurethanes, diureas, dicarbonates, and diketones of the formulas:

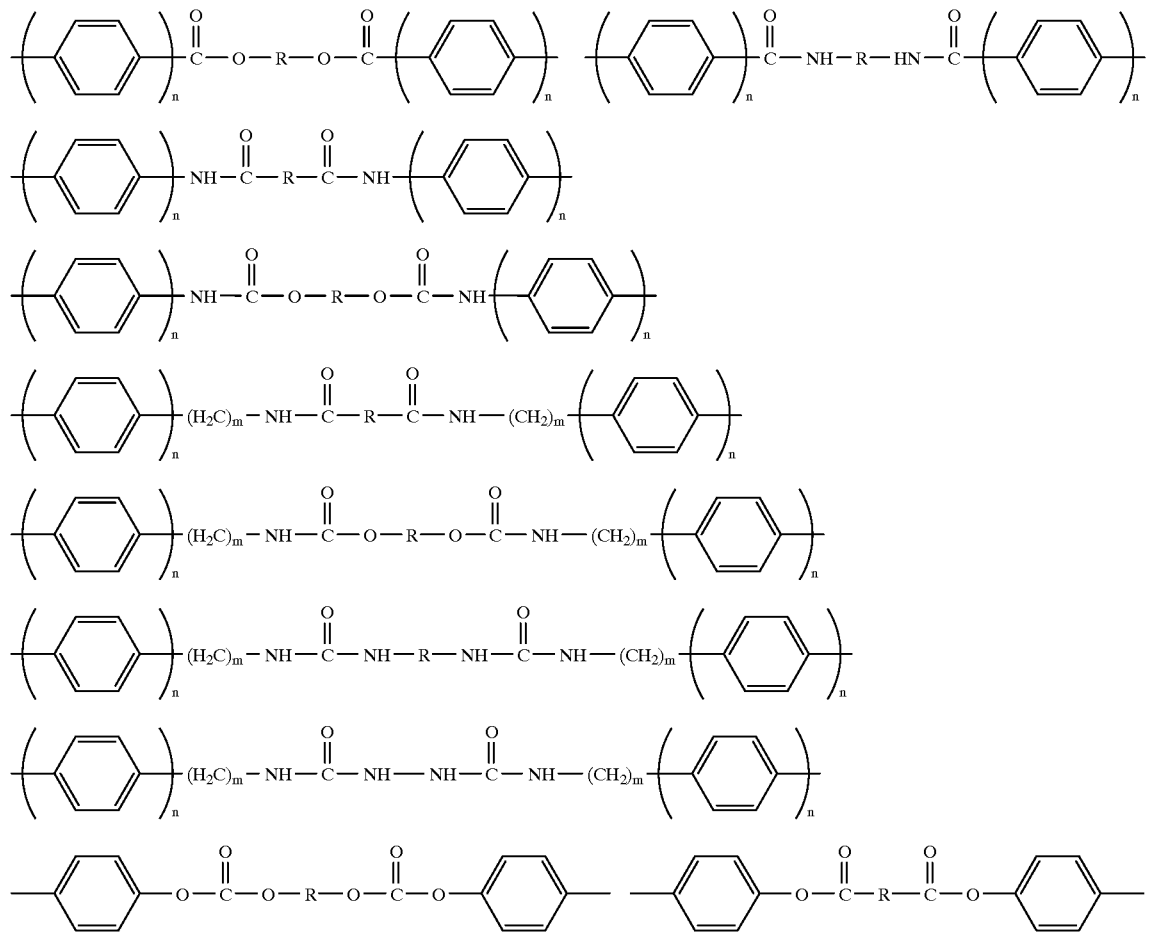

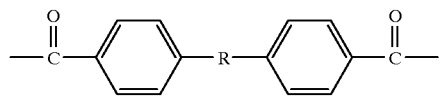
and mixtures thereof, wherein n is 0 or 1; m is 0, 1, or 2; R is an alkylene group with 2 to about 24 carbon atoms, a vinylene, an acetylene, an ethylene ether group of the formula $(CH_2CH_2O)_xCH_2CH_2$— where x is from 1 to about 10, or is an aromatic containing group of the formula:
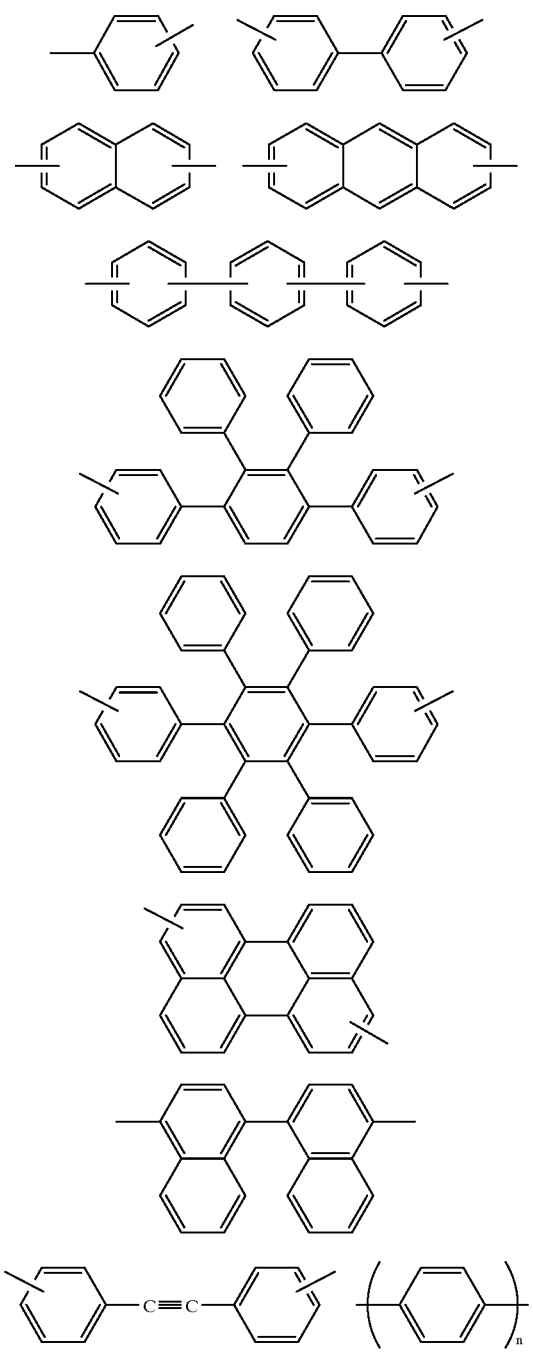
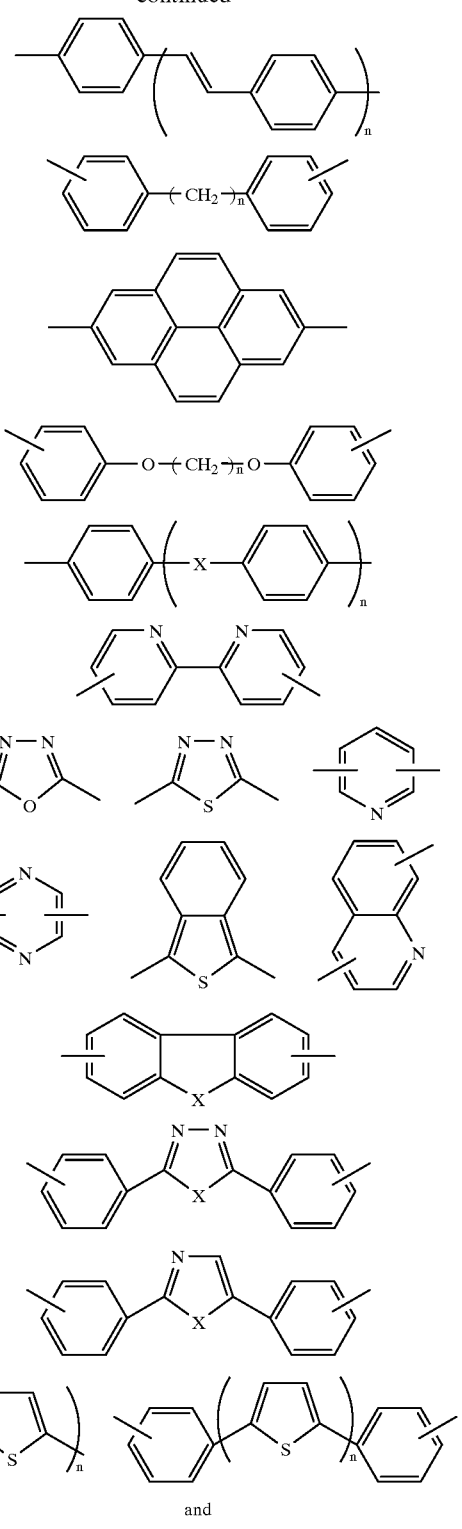
and

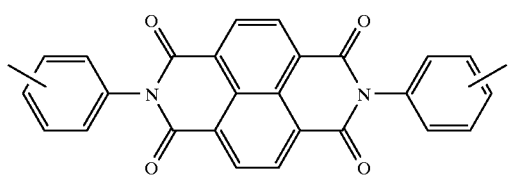

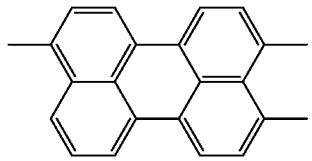
and

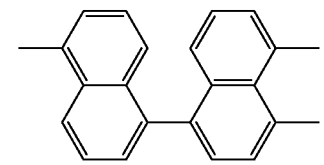

wherein n is an integer from 1 to about 12; X is O, S, Se, NH, N—CH$_3$, or N—Ph. The diimide groups can be, for example, of the formulas:

The diether groups can be, for example, of the formulas:

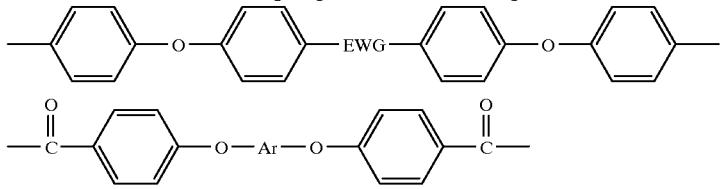

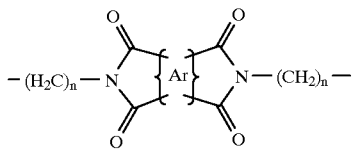

and mixtures thereof, wherein Ar is an aromatic group can be for example, of the formulas:

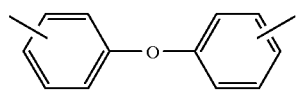

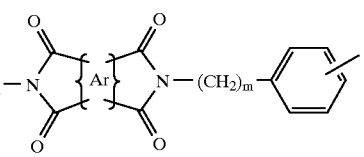

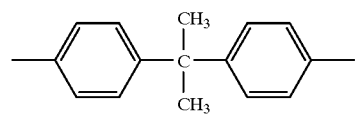

and mixtures thereof, wherein n is an integer from 0 to 1; m is an integer from 0 to 2, and Ar is an aromatic group, for example, of the formulas:

and mixtures thereof, where EWG is a electron withdrawing group, for example, of the formulas:

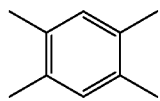 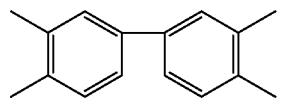

 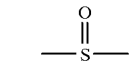  

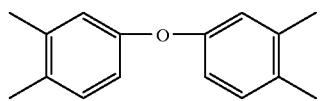 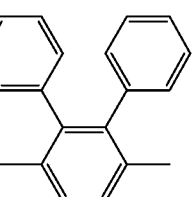

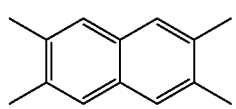 

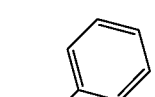

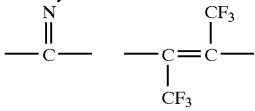 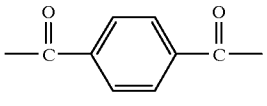

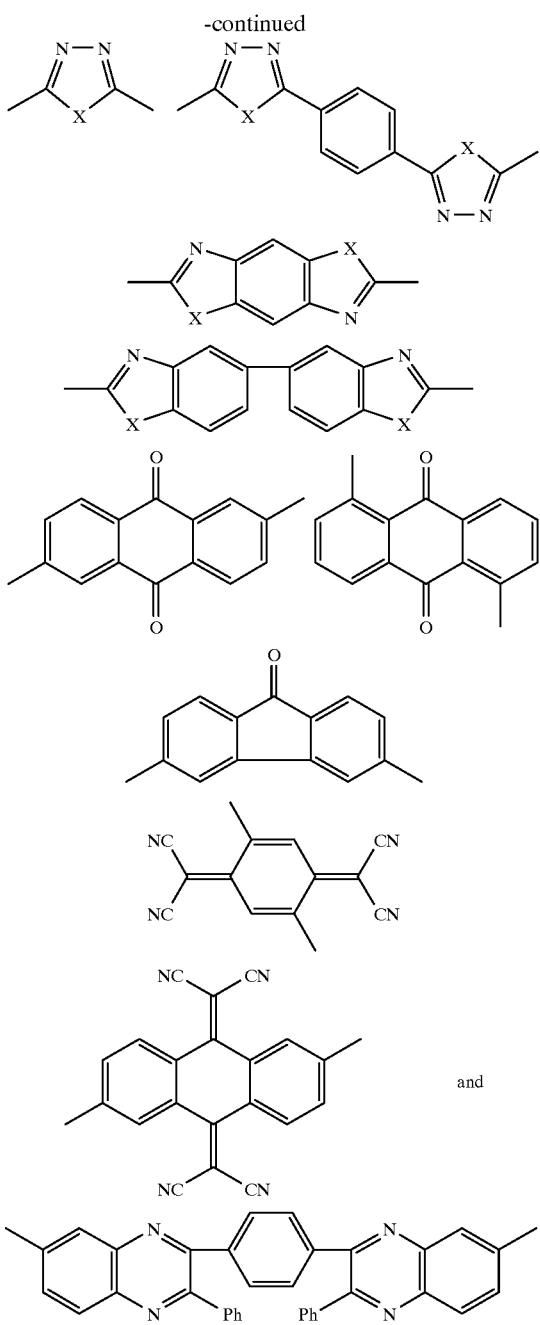
the unsaturated groups can be for example, of the formula:
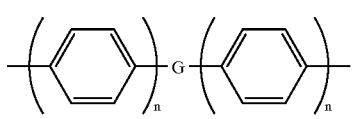
wherein n is an integer 0 or 1, and G can be for example, of the formulas:
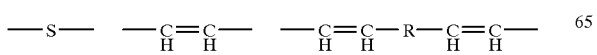
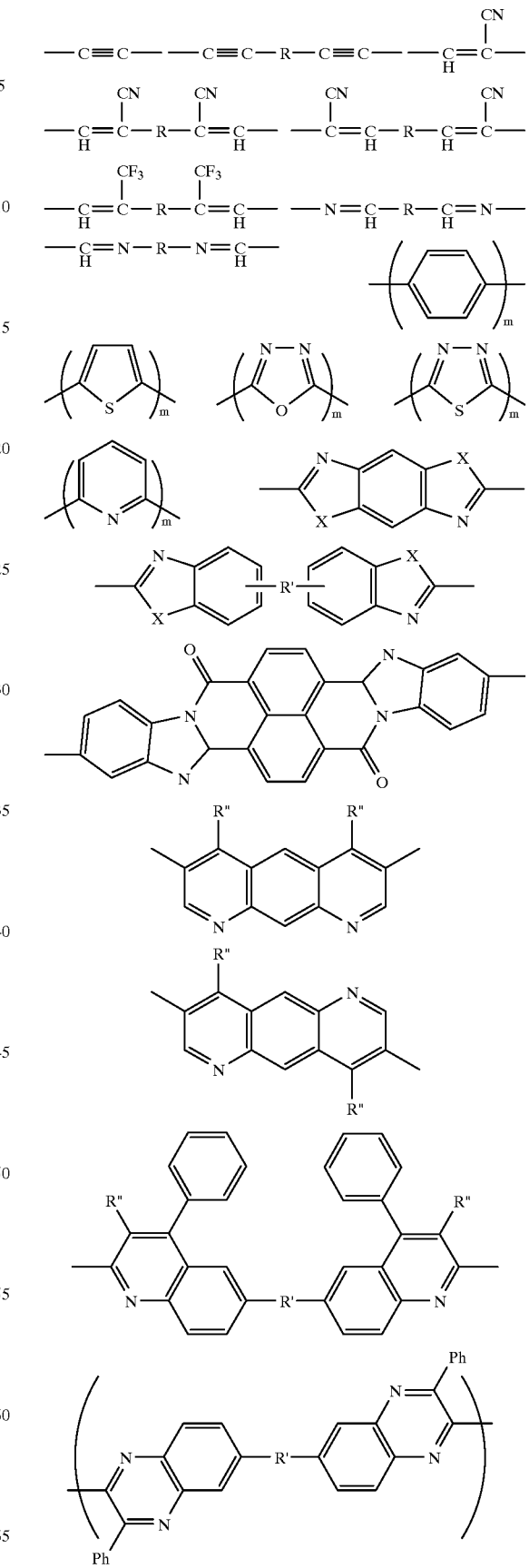

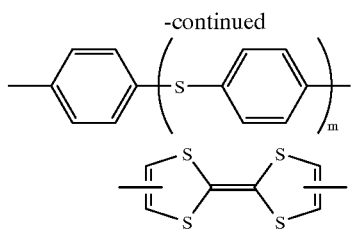
and

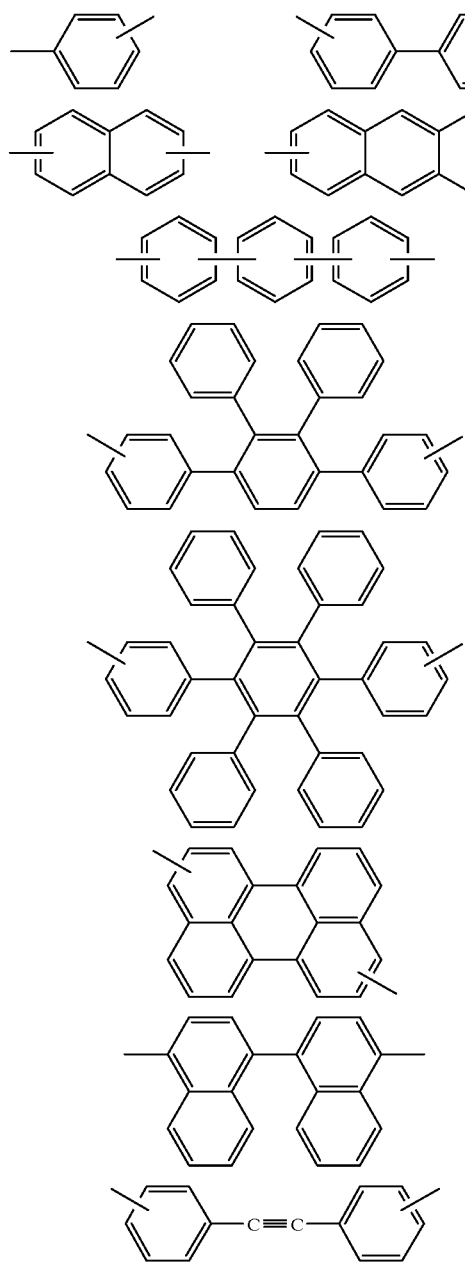

wherein m is an integer from 1 to 6, R' is nil, O, S, alkylene groups with 1 to about 12 carbon atoms, 1,2-vinylene, acetylene, 1,3-phenylene, 1,4-phenylene, or 2,2-propyl; R" is a hydrogen or phenyl group; R is an alkylene group with 2 to about 24 carbon atoms, an ethylene ether group of the formula —(CH$_2$CH$_2$O)$_x$CH$_2$CH$_2$— where x is an integer from 1 to about 10, an aromatic group of the formula:

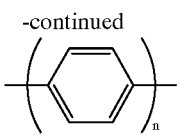

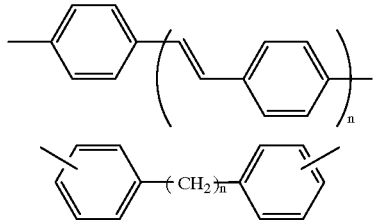

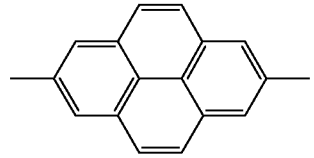

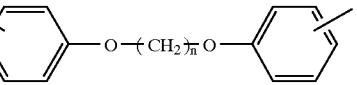

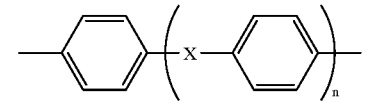

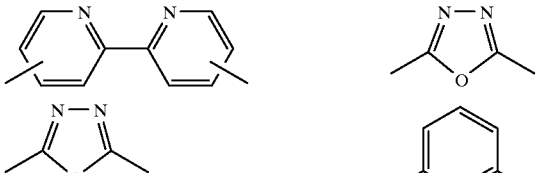

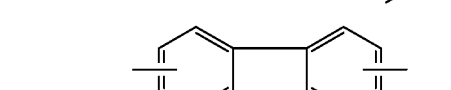

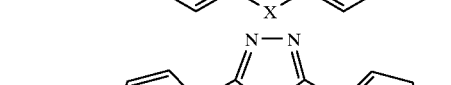

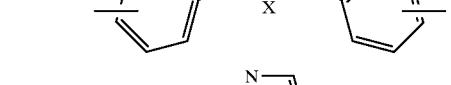

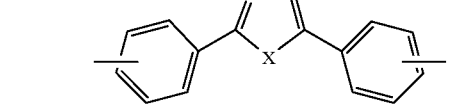

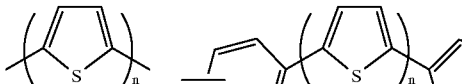

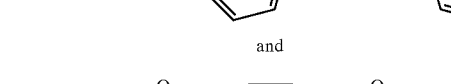

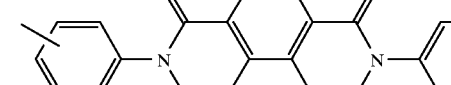

and

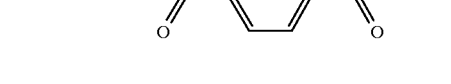

wherein n is an integer from 1 to about 12; X is O, S, Se, NH, N—CH$_3$, or N-Ph. The perfluoroalkyl groups can be for example, of the formula —(CH$_2$)n(CF$_2$)$_m$F, wherein n is an integer from 0 to about 3, and m is an integer from 1 to about 16.

Siloxane groups can be for example, of the formula: —(CH$_2$)$_n$[OSi(CH$_3$)$_2$]$_m$—CH$_3$, wherein n is an integer from 0 to about 10 and m is an integer from 1 to about 12.

Silane groups can be, for example, of the formula —Si(CH$_3$)$_2$C$_n$H$_{2n+1}$ where n is an integer from 1 to about 24. The alkylated phenyl group can be for example, of the formula:

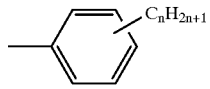

wherein n is an integer from 3 to about 24.

Alkoxylated phenyl groups can be, for example, of the formula:

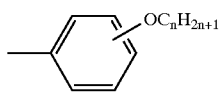

wherein n is an integer from 3 to about 24. The color dye containing groups can be for example, of the formulas:

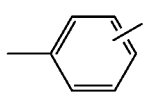

wherein n and m are integers from 0 to about 10, and Dye can be for example, of the formulas:

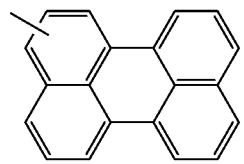

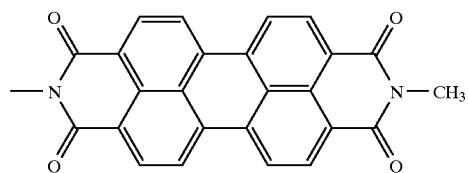

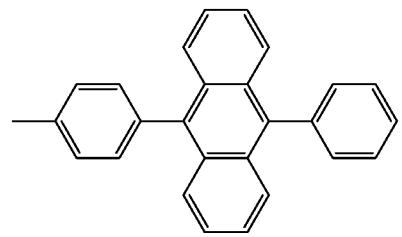

-continued

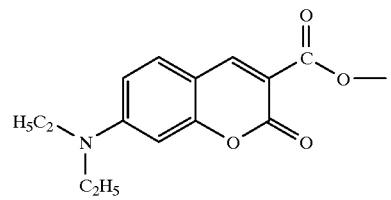

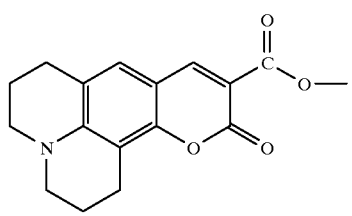

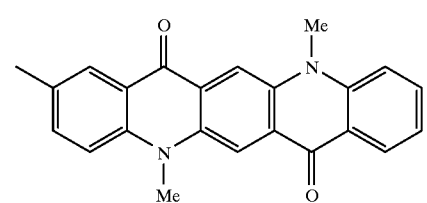

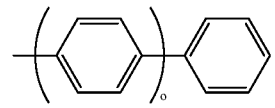

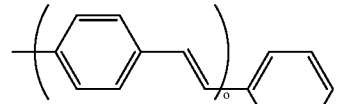

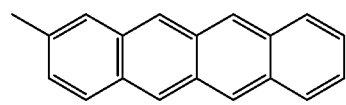

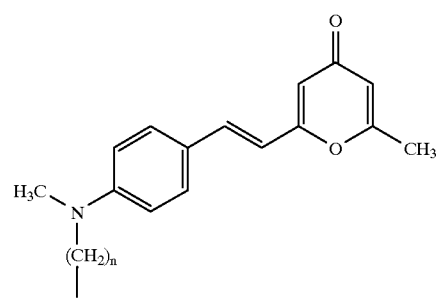

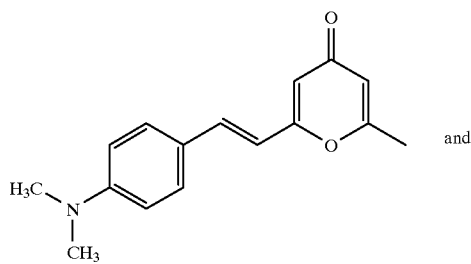

and

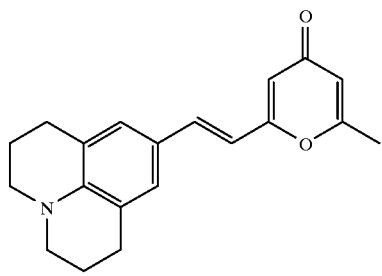

and mixtures thereof, wherein o is an integer from 2 to about 5. The ionic groups are ionizable and hydrophilic and can be, for example, carboxylic acids, metal carboxylates, sulfonic acids, metal sulfonates, quaternary ammonium ions, pyridinium ions, mercaptan groups, alcohol groups, and mixtures thereof. The ion binding groups are hydrophilic and can be, for example, ethylene oxide, 2,2'-bipyridine, crown ethers, porphyrins, calixarenes, 8-hydroxyquinoline compounds, 2-hydroxyquinoline compounds, cyclodextrins, catenanes, rotaxanes, and the like materials, and mixtures thereof.

Preferred mers for forming polymers and copolymers of the present invention are, for example, of the formulas:

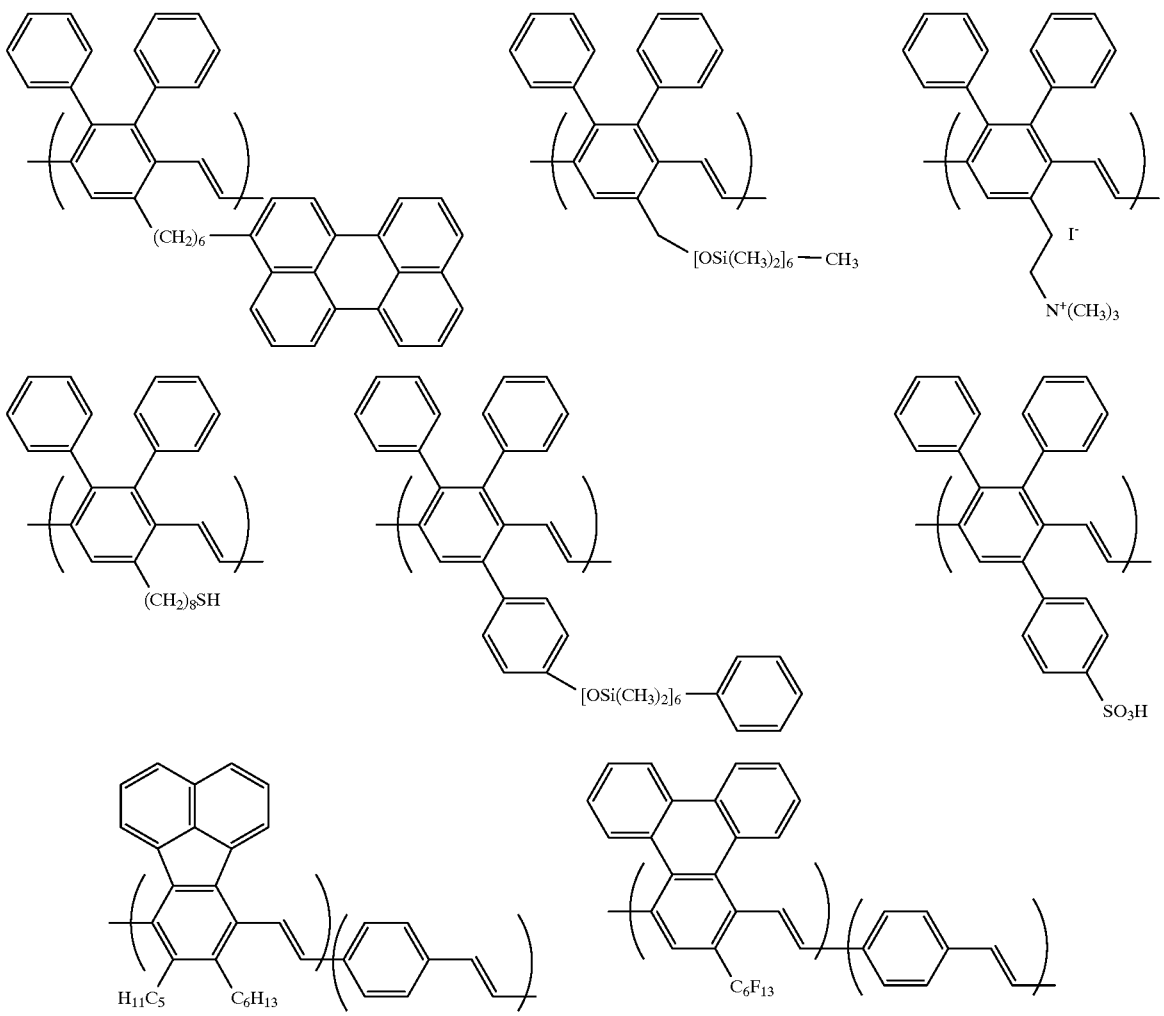

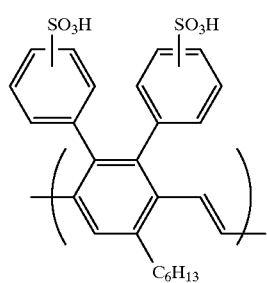
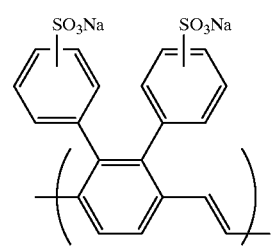
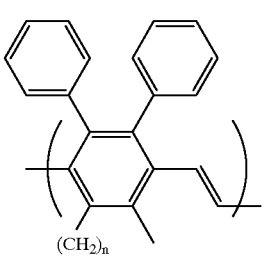
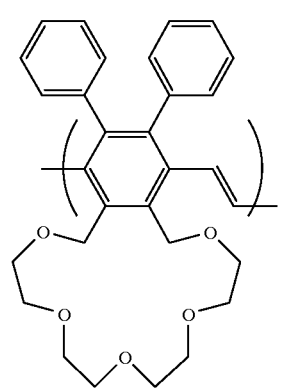
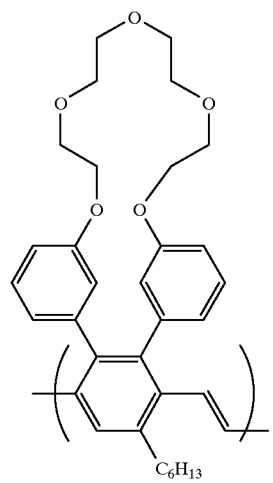
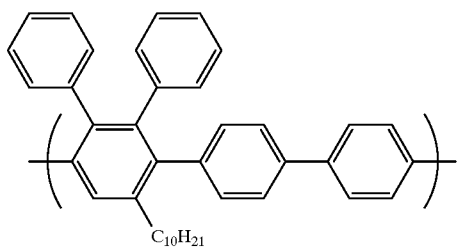
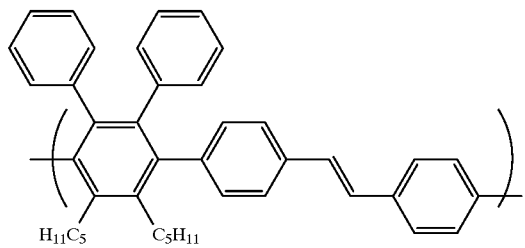
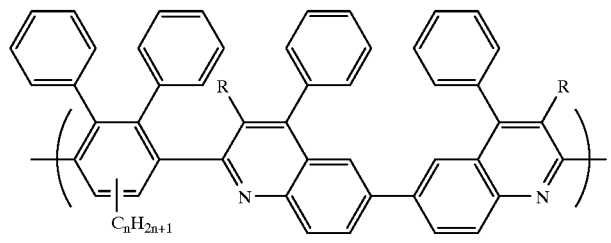
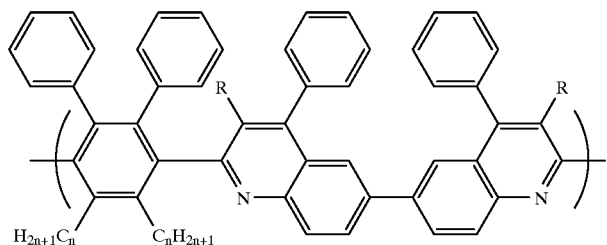
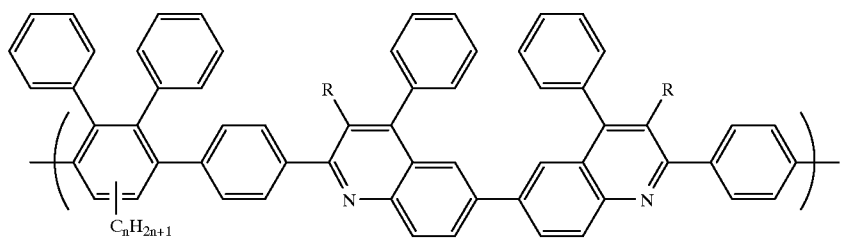

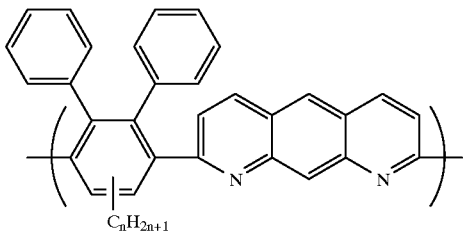

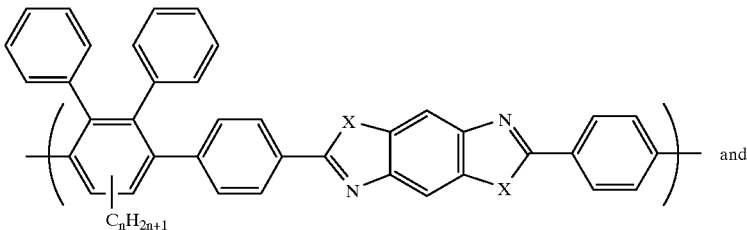
and

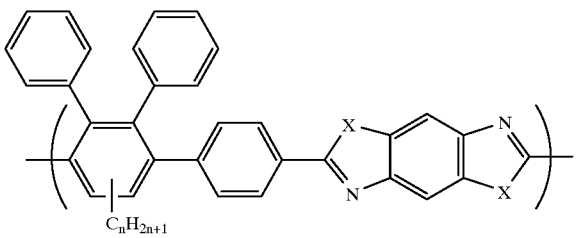

wherein n is an integer from 3 to about 24; R is hydrogen or a phenyl group; and X is O or S. The polymers and copolymers of the present invention can have weight average molecular weights, for example, from about 5,000 to about 2,000,000, and preferably from about 10,000 to about 500,00, and more preferably from about 10,000 to about 100,000, as determined by gel permeation chromatography. The polymers and copolymers of the present invention are preferably substantially or completely soluble in organic solvents thus enabling them to be selected for the deposition of coatings. The preferred organic solvents are, for example, nitromethane, chloroform, methylene chloride, tetrahydrofuran, chlorobenzene, o-dichlorobenzene, 1,1,2-trichloroethane, fluorobenzene, m-cresol, methyl ethyl ketone, benezene, toluene, xylenes, and a mixture thereof.

In embodiments, the present invention provides a light emitting diode device comprising a single layer or multi-layer films of the aforementioned polymers or copolymers comprised of mers or monomers of, for example, the formulas:

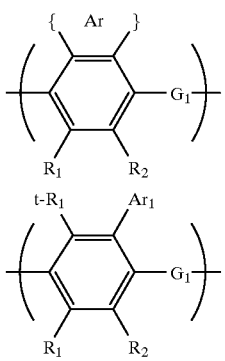
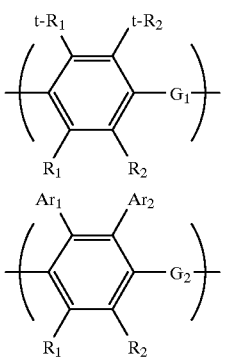

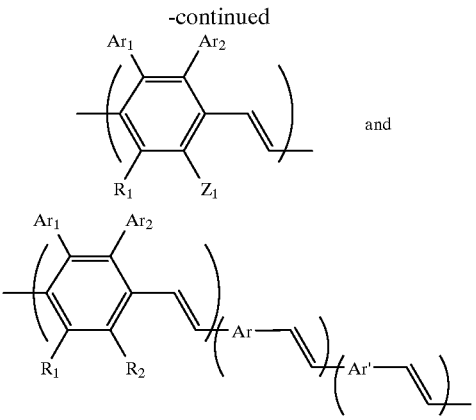
and

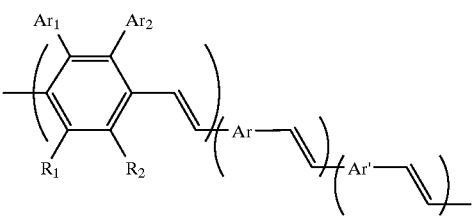

The light emitting diode devices of the present invention can further comprise a dopant in the single layer or multi-layer film of the polymer, wherein the dopant is for example, an electron transport molecule, a hole transport molecule, a light emitting compound, an ionizable salt of an ionomer or ionophore, and the like, and mixtures thereof, and for example, organic laser dyes, for use, for example, in organic light emitting diode applications and device fabrication. The dopant can be selected in amounts of from about 0.01 to about 50 weight percent based on the weight of the polymer, and preferably from about 0.01 to about 20 weight percent, and more preferably from about 0.01 to about 5 weight percent. The polymer layer or film formed therefrom can be a contact modification layer which can include, for example, phthalocyanines, perylenes, lithium fluoride, silver bromide, copper iodide, poly(anilines), and the like additives, and mixtures thereof.

The present invention provides processes for preparing light emitting articles comprising, for example, depositing from an aqueous solution, an organic solution, or a mixture thereof, such as in a self-assembling, layer-by-layer deposition sequence, the aforementioned conductive polymers or copolymers onto a supporting substrate, which can be conductive or non-conductive depending upon the intended applications and device specifications.

The monomers selected for the preparation of the soluble polymer compositions of the present invention can be prepared using known reactions, for example, according to the following schemes. Aldol condensation of a diketone and a properly substituted ketone gives a cyclopentadienone (1). The Diels-Alder reaction of 1 with norbornylene or a acetylene compound gives 2 or 3 respectively. Hydrolysis of 3d with potassium hydroxide give the terephthalic acid 4, which is converted to the corresponding acid chloride, followed by reacting with sodium azide or with tetramethyl tin in the presence of a palladium catalyst to give 5 or 3e respectively. Reduction of 3d gives 6 which can be converted to bischloromethyl compound 7 or oxidized to give terephthaldehyde 9. Compound 7 can be converted to the dicyano compound 8 which can be reduced to 11. Compound 7 can also be converted to 10 with various difunctional groups.

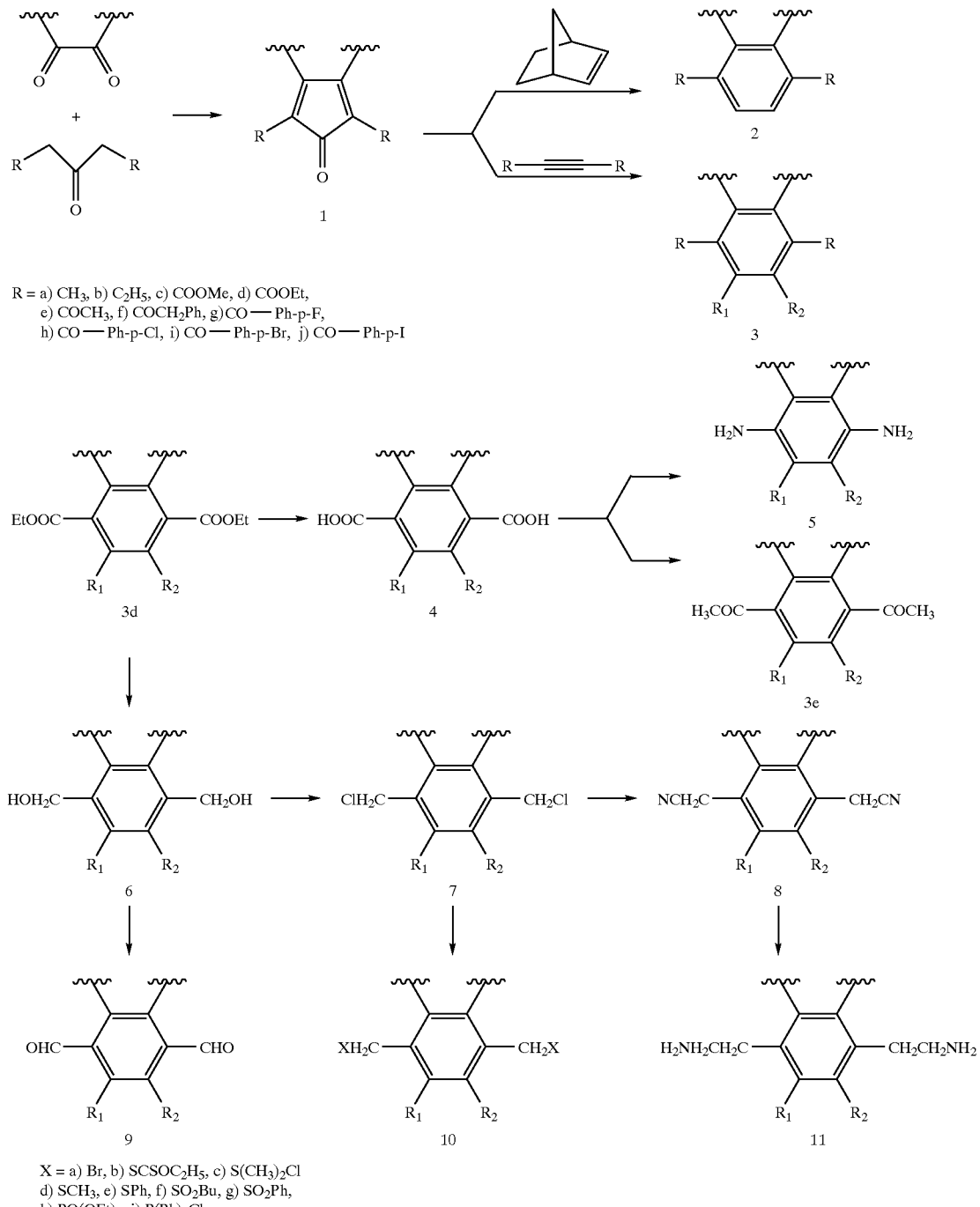

R = a) $CH_3$, b) $C_2H_5$, c) COOMe, d) COOEt,
e) $COCH_3$, f) $COCH_2Ph$, g)CO—Ph-p-F,
h) CO—Ph-p-Cl, i) CO—Ph-p-Br, j) CO—Ph-p-I

X = a) Br, b) $SCSOC_2H_5$, c) $S(CH_3)_2Cl$
d) $SCH_3$, e) SPh, f) $SO_2Bu$, g) $SO_2Ph$,
h) $PO(OEt)_3$, i) $P(Ph)_3Cl$

Other monomers can be synthesized similarly according to the following schemes. Aldol condensation of a diketone and a diphenylacetone gives a cycylpentadienone 12. The Diels-Alder reaction of 12 with norbornene or an acetylene compound gives 13 or 14 respectively. The dibromo compound 14c can be converted to the diiodo compound 14d using copper iodide or to the dicyano compound 14i with copper cyanide which can be reduced to the diamino 15. The dimethoxy compound 14e can be demethylated to the dihydroxy compound 16 which can react with trifluoromethanesulfonic anhydride to give bistriflate 17. Hydrolysis of 14f with potassium hydroxide gives the diacid 18, which is converted to the corresponding acid chloride, followed by reacting with tetramethyl tin in the presence of a palladium catalyst to give 19. Reduction of 14f gives 20 which can be oxidized to 21 or react with thionyl chloride to give the corresponding bischloromethyl compound, followed by reacting with copper cyanide to give 22. This can be reduced to the diamino compound 23. Reduction of the dinitro compound 14h gives the corresponding diamino compound 24.

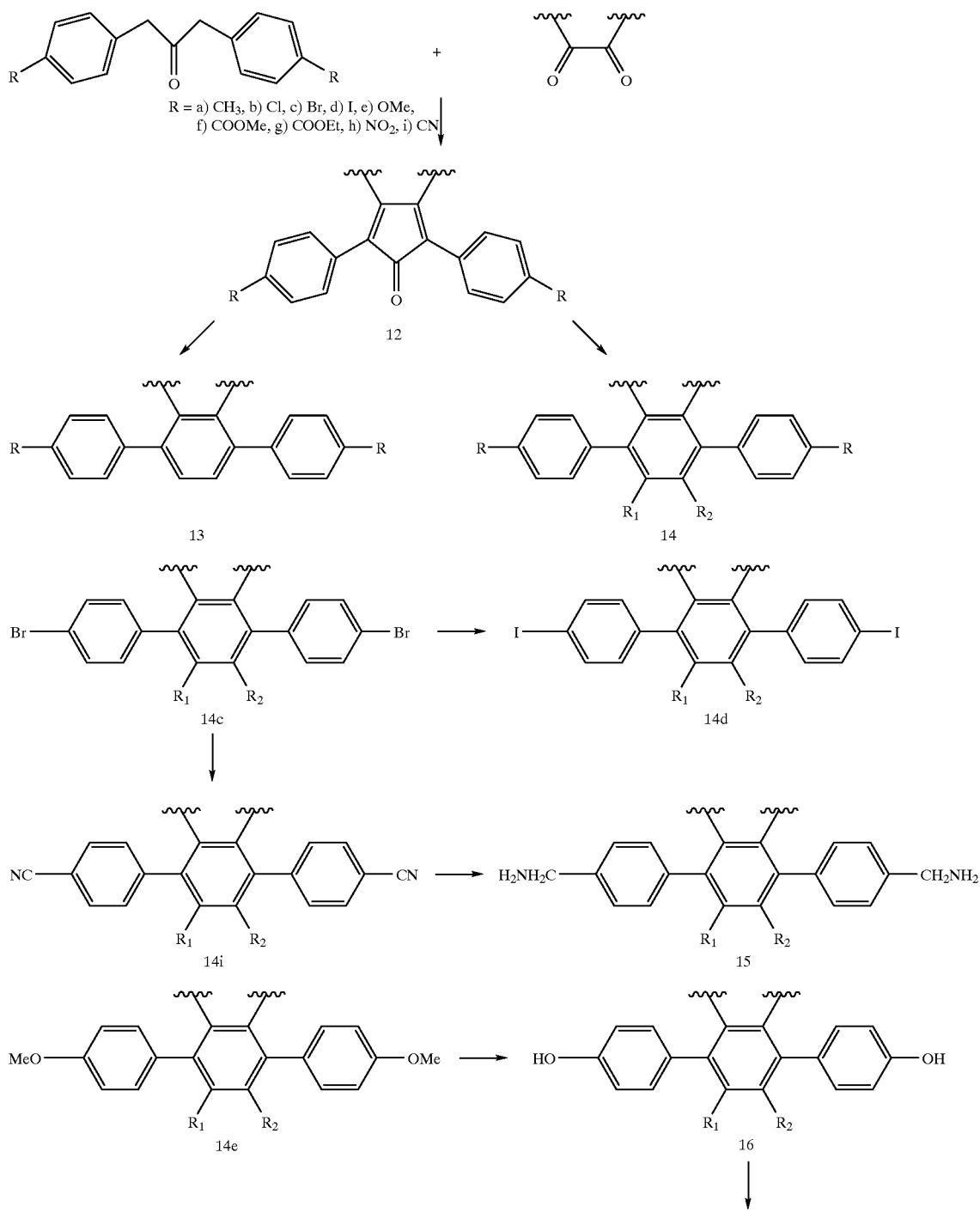

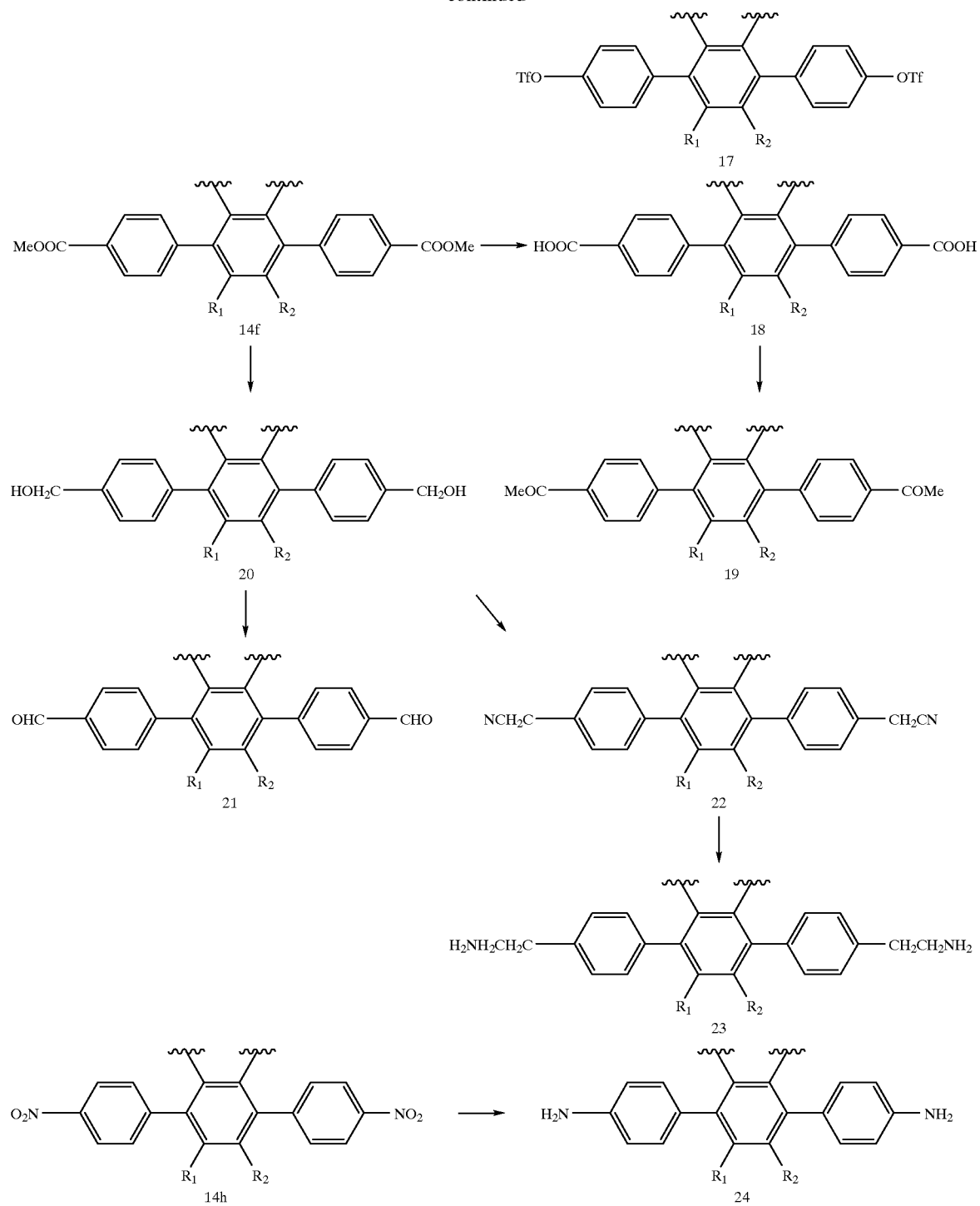

The polymer compositions of the present invention can be prepared via known polymerization methods, for example, as described below:

Dicarbonyl type polymers, such as, polyesters, polycarbonates, polyamides, polyurethanes, and polyureas can be prepared from dicarboxylic acid monomers, diester monomers, diamino monomers or diphenol monomers. A dicarboxylic acid monomer (4 or 18), or a diester monomer (3d or 14f) polymerizes with a diol or a diamine to give a polyester or a polyamide, respectively. A diol monomer (6, 16, or 20) polymerizes with a dicarboxylic acid, its diacid chloride, or its dimethyl or diethyl ester, to give a polyester. A diol monomer (6, 16, or 20) can also polymerize with a diisocyanate, or dichloroformate to give a polyurethane or a polycarbonate. A diamine monomer (5, 11, 15, 23 or 24) polymerizes with a carboxylic acid, its diacid chloride or dialkyl ester, a diisocyanate, or a dichloroformate to give a polyamide, a polyurea or a polyurethane respectively. A diamine monomer (5, 11, 15, 23, or 24) polymerizes with a dialdehyde or a dianhydride to give a polyimine or a polyimide, respectively. A dialdehyde monomer (9 or 21) polymerizes with a diamine to give a polyimine. A di-p-halophenylketone monomer (3g, 3h, 3i, or 3j) polymerizes with a bisphenol monomer in the presence of potassium carbonate to give a polyether ketone. Bisphenol monomer 16 polymerizes with a di-halo-phenyl monomer of the formula X—Ar—EWG—Ar—X, wherein EWG is an electron withdrawing group, and X=Cl, Br, I or —OTf (triflate), in the presence of a base to give a polyether polymer.

A substituted para-di-halomethyl-benzene monomer such as 7, 10a, 10b, 10c, 10d, or 10e can undergo 1,6-polymerization in the presence of a base to give a corresponding precursor polymer which can be converted to a polyphenylene vinylene derivative; or, it can polymerize in the presence of a large excess of a base to give a polyphenylene vinylene derivative directly. Any two monomers of the type of the present invention can copolymerize with co-poly(phenylene vinylene). Monomers of the present invention can copolymerize with known monomers of the same or different type to give a co-poly(p-phenylene vinylene). This polymerization process is disclosed in U.S. Pat. No. 5,558,904, the disclosure of which is incorporated by reference herein in its entirety.

A dialdehyde monomer (9 or 21) can polymerize via the Knoevenagel reaction with a para-substituted aromatic dicyanomethyl monomer to give a cyano vinylene polymer, or a dicyanomethyl monomer (8 or 22) polymerizes via the Knoevenagel reaction with a para-substituted aromatic dialdehyde to give a cyano vinylene polymer, as described, for example, in U.S. Pat. No. 5,514,878, the disclosure of which is incorporated by reference herein in its entirety.

A dialdehyde monomer such as 9 or 21 can also polymerize with a xylylene bisphosphonic acid tetraethyl ester (10h) or xylylene bisphosphonium salt (10i) via the Wittig reaction to give, for example, poly(phenylene vinylene) derivatives.

A di-p-halophenylketone monomer (3g, 3h, 3i or 3j) can homo-polymerize or copolymerize with another aromatic dihalide monomer in the presence of a nickel or a palladium catalyst to give a corresponding polyketone. A bishalide monomer (14a, 14b, 14c, or 14d) or a bistriflate monomer (17) can homo-polymerize or copolymerize with another di-functional monomer of the formula Y—R—Y, wherein R is an unsaturated group, Y=vinyl, ethynyl, boronic acid, boronic alkyl ester, Cl, Br, I, or trialkyltin in the presence of a nickel or palladium catalyst to give a conjugated polymer.

An aromatic diacid monomer (4 or 18) or it diester (3c, 3d, 14f, or 14g) can polymerize with 2,5-diamino-1,4-benzenedithio, or 2,5-diamino-1,4-benzenediol, or 1,2,4,5-tetraaminobenzene to give rigid rod polybisthiazole or polybisoxazole, or polybisimidazole, respectively. An aromatic diacid monomer (4) or it diester (3c or 3d) can also polymerize with 3,3'-dimercaptobenzidine, or 3,3'-dihydroxybenzidine, or 3,3'-diaminobenzidine to give rigid rod heterocyclic polymers as described in U.S. Pat. No. 4,533,693, the disclosure of which is incorporated by reference herein in its entirety.

A diacetyl monomer (3e, 3f or 19) can be polymerized with a dibenzoylbenzidine or a diacetyl-diamino benzene in the presence of di-m-cresyl phosphate to polyquinolines as described by Stille in *Macromolecules*, 14, 870–880 (1981), the disclosure of which is incorporated by reference herein in its entirety.

The invention will further be illustrated in the following non limiting Examples, it being understood that these Examples are intended to be illustrative only and that the invention is not intended to be limited to the materials, conditions, process parameters, and the like, recited herein. Parts and percentages are by weight unless otherwise indicated. All reagents were purchased from Aldrich Chemical Company and used without further purification.

The following examples describe the synthesis of several diphenylated terephthalic acid diethyl ester derivatives which are important intermediates for the synthesis of the polymer compositions of the present invention.

EXAMPLE I

Diethyl 5-Hexyl-2,3-diphenyl-1,4-benzenedicarboxylate: To a cooled solution, at about 0° C., of benzil (63.0 g, 300 mmol) and diethyl acetonedicarboxylate (72.6 g, 0.36 mol) in methanol (200 mL) was slowly added a solution of NaOH (12.0 g, 300 mmol) in methanol (60 mL) with stirring. The mixture was warmed to room temperature and stirred for about 16 hours. The resultant yellow precipitate was filtered and dried. $H_2SO_4$ was then added dropwise with stirring to a slurry of the yellow precipitate in acetic anhydride (350 mL) until all of the yellow precipitate had dissolved. An additional five drops of $H_2SO_4$ was then added to the solution. Finally, while maintaining the temperature of the solution below about 80° C., water was added dropwise to decompose excess acetic anhydride. The resultant orange precipitate was filtered, air dried and recrystallized from ligroin (100.5 g, 92% yield): mp 119–121° C. A solution of 2,5-dicarboethoxy-3,4-diphenylcyclopentadienone (20.7 g, 55.0 mmol) and of the 1-octyne (6.06 g, 55.0 mmol) in toluene (50 mL) was refluxed for 3 days. Evaporation of the solvent yielded an orange oil. An analytical sample, of about 0.5 gram, was obtained by column chromatography on silica ($CH_2Cl_2$) as a light orange oil in 97% yield.

EXAMPLE II

5-Hexyl-1,4-bis(hydroxymethyl)-2,3-diphenylbenzene: A solution of diethyl 2,3-diphenyl-1,4-benzenedicarboxylate (21.1 g, 46.0 mmol) in anhydrous THF (175 mL) was added dropwise with stirring over a 0.5 hour period to a suspension of lithium aluminum hydride (7.89 g, 208 mmol) in 350 mL of anhydrous THF at 0° C. This solution was stirred at room temperature for 1 hour and refluxed for 24 hours. The solution was then cooled and treated with: 1) 8 mL of water, added dropwise and stirred carefully for 0.25 hour, 2) 24 mL of 15% NaOH with stirring for an additional 0.25 h, and 3) 24 mL of water with additional stirring for 0.25 hour. The THF was evaporated and the resulting mixture was stirred for 12 hours with a 10% (v/v) $H_2SO_4$ solution. The product was filtered and recrystallized from aqueous ethanol to give a white solid (12.6 g, 73% yield): mp 136–7° C.

EXAMPLE III

5-Hexyl-1,4-bis(chloromethyl)-2,3-diphenylbenzene: In a 100 mL round-bottomed flask, equipped with a stirring bar, condenser and drying tube, was placed 5-hexyl-1,4-bis(hydroxymethyl)-2,3-diphenylbenzene (18.7 g, 50.0 mmol) and thionyl chloride (89.3 g, 750 mmol). The mixture was stirred at 50° C. for 1 hour and at room temperature for 23 hour. The excess thionyl chloride was removed under reduced pressure and the residue was dissolved in $CH_2Cl_2$. The $CH_2Cl_2$ solution was washed with water (2×200 mL), a 5% NaCl solution (200 mL), dried with $MgSO_4$ and the solvent was removed under reduced pressure. An analytical sample was obtained by column chromatography on silica (hexane) as an orange oil (13.3 g, 65% yield).

EXAMPLE IV

Diethyl fluoranthrene-8-hexyl-7,10-dicarboxylate Acenaphthenequinone (23.2 g, 127 mmol), diethyl acetonedicarboxylate (30.2 g, 150 mmol) and methanol (140 mL) were loaded into a 500 mL three-neck round bottom flask. This was treated with a solution of triethylamine (20.4 mL) in methanol (50 mL). The resultant deep purple solution was stirred for 20 min and then left to stand overnight at room temperature. The purple crystalline material was filtered and washed with methanol (20 mL) and air-dried to give diethyl 8-oxo-8H-cyclopenta-acenaphthylene-7,9-dicarboxylate (29.1 g, 66%). In a 500 mL round bottom flask was loaded diethyl 8-oxo-8H-cyclopenta-acenaphthylene-7,9-dicarboxylate (10.0 g, 28.7 mmol) and toluene was added (40 mL) to give a purple slurry. 1-Octyne (3.16 g, 28.7 mmol) was added with stirring and the mixture was heated to reflux for three days with continuous stirring. The solvent was then removed by rotary evaporation and the oily residue passed through a silica gel column (chloroform) and the first fraction collected (11.5 g, 89% yield).

EXAMPLE V

8-Hexyl-7,10-Bis(hydroxymethyl)fluoranthrene Under a nitrogen atmosphere in a 3 neck round bottom flask was loaded diethyl fluoranthrene-8-hexyl-7,10-dicarboxylate (4.0 g, 9.3 mmol) and THF (80 mL). This was cooled in an ice/bath and lithium aluminum hydride (1.41 g, 37.2 mmol) was added followed by an additional amount of THF (40 mL). The dark brown solution was stirred for 1 hour, and then refluxed for an additional 6 hour, and then cooled to room temperature and stirred overnight. Water (4 mL) was then added to destroy excess lithium aluminum hydride followed by NaOH (1.5 g in 10 mL of water) and finally by water (4 mL) in 15 min. intervals. This was then stirred for 30 min. The solvent was then removed and 10% sulfuric acid (80 mL) added and stirred overnight. The brown precipitate was then filtered and washed with water (3×10 mL) and air-dried to give the title compound (2.68 g, 74% yield).

EXAMPLE VI

8-Hexyl-7,10-Bis(chloromethyl)fluoranthrene In a 100 mL round bottom flask was loaded 8-hexyl-7,10-bis-(hydroxymethyl)-fluoranthrene (0.80 g, 2.3 mmol), thionyl chloride (5.0 g, 42 mmol) and methylene chloride (15 mL) and stirred at room temperature for 1 hour, and then refluxed for an additional 2 hour, and finally stirred overnight. The solvent was removed by rotary evaporation to give a pale yellow powder.

EXAMPLE VII

Diethyl 2,3-di(4-fluorophenyl)-1,4-benzenedicarboxylate In a 500 mL round bottom flask was loaded difluorobenzil (12.3 g, 50.0 mmol), diethyl acetonedicarboxylate (12.1 g, 60.0 mmol) and methanol (100 mL) with stirring. This was cooled in an ice/water bath and methanolic NaOH (2 g in 50 mL of methanol) added to the mixture. This was stirred overnight. The resultant yellow precipitate was filtered and washed with methanol (2×20 mL) and air-dried. The yellow precipitate was then added to acetic anhydride (300 mL). The mixture was cooled in an ice/water bath and then sulfuric acid was added dropwise until an orange solution resulted. Several more drops of sulfuric was then added and the solution stirred for 30 min. The excess acetic anhydride was destroyed by addition of water. Excess water (1 L) was added to precipitate out the orange product. The orange precipitate was filtered and washed repeatedly water and air-dried to give 2,5-dicarboethoxy-3,4-di-(4-fluorophenyl)-cyclopentadienone (16.7 g, 81% yield). In a 100 mL round-bottom flask was loaded 2,5-dicarboethoxy-3,4-di-(4-fluorophenyl)-cyclopentadienone (2.6 g, 6.3 mmol), norbornadiene (2.9 g, 31.5 mmol) and toluene (45 mL) with stirring. The mixture was refluxed for 5 hour and then the solvent was removed. Methanol was then added to precipitate out the white product. The white precipitate was filtered and washed with methanol (2×5 mL) and air-dried (1.22 g, 47% yield).

EXAMPLE VIII 1,4-Bis(hydroxymethyl)-2,3-di(4-fluorophenyl)-benzene: A 100 mL 3 neck round-bottom flask equipped with a condenser and an addition funnel was flushed with nitrogen and then loaded with diethyl-2,3-di(4-fluorophenyl)-1,4-benzenedicarboxylate (1.22 g, 2.98 mmol) in anhydrous THF (25 mL). Lithium aluminum hydride (1.0 M in THF, 11.4 mL, 11.4 mmol) was then added dropwise via the addition funnel to the reaction mixture and the mixture was then refluxed overnight. The mixture was cooled to room temperature and the excess lithium aluminum hydride was destroyed by dropwise addition of water. 15% NaOH (1 mL) was then added followed by more water (3 mL). The mixture was filtered and the solvent was removed by rotary evaporation. The product was then dissolved in chloroform and filtered. Removal of the chloroform gave a white solid (0.45 g, 46% yield).

EXAMPLE IX 1,4-Bis(chloromethyl)-2,3-di-(4-fluorophenyl)-benzene: A 250 mL 3 neck round-bottom flask equipped with a condenser was flushed with nitrogen and then loaded with 1,4-bis(hydroxymethyl)-2,3-di-(4-fluorophenyl)-benzene (2.70 g, 8.28 mmol), thionyl chloride (2.20 g, 18.5 mmol), methylene chloride (90 mL) and 3 drops of pyridine. The solution was then refluxed overnight and then cooled to room temperature. Methylene chloride was removed by rotary evaporation and then methanol was added to precipitate out the white product (0.77 g, 26% yield).

EXAMPLE X

Diethyl 5-hexyl-2,3-di(4-fluorophenyl)-1,4-benzenedicarboxylate: A 250 mL 3 neck round-bottom flask equipped with a condenser was flushed with nitrogen and then loaded with 2,5-dicarboethoxy-3,4-di(4-fluorophenyl)-cyclopentadienone (10 g, 24.3 mmol) and toluene (35 mL) and stirred for 5 min to give a deep orange solution. 1-Octyne (2.67 g, 24.3 mmol) was then added via a syringe to the solution. The reaction was then heated and refluxed for 3 days. The solvent was removed by rotary evaporation and the orange oily liquid was passed through a silica gel column (chloroform).

EXAMPLE XI

5-Hexyl-1,4-bis(hydroxymethyl)-2,3-di(4-fluorophenyl)-benzene: A 250 mL 3 neck round-bottom flask equipped with a condenser was flushed with nitrogen and then loaded with diethyl 5-hexyl-2,3-di-(4-fluorophenyl)-1,4-benzenedicarboxylate (4 g, 8.1 mmol), anhydrous THF (40 mL) and then cooled in an ice/water bath. Lithium aluminum hydride (1.23 9, 32.4 mmol) followed by THF (40 mL) was added to the reaction mixture with stirring. The mixture was warmed to room temperature and then refluxed for 6 hours. This was then cooled to room temperature and the excess lithium aluminum hydride was destroyed by dropwise addition of water. NaOH (1.5 g in 10 mL of water) was then added and stirred for 15 min. The solvent was then removed by rotary evaporation and then 10% sulfuric acid (80 mL) was added to the white gelatinous product and stirred overnight. The white precipitate was filtered and washed with water and air-dried (3.12 g, 94.0% yield).

EXAMPLE XII

5-Hexyl-1,4-bis(chloromethyl)-2,3-di(4-fluorophenyl)-benzene: A 250 mL 3 neck round-bottom flask equipped with a condenser was flushed with nitrogen and then loaded with 5-hexyl-1,4-bis(hydroxymethyl)-2,3-di(4-fluorophenyl)-benzene (1.35 g, 3.3 mmol), thionyl chloride (7 g, 58.8 mmol) and methylene chloride (10 mL) was stirred at room temperature for 1 hour, and then refluxed for an additional 2 hour, and finally stirred at room temperature overnight. The solvent was then removed by rotary evaporation to give a pale yellow oil (1.1 g, 74.7% yield).

EXAMPLE XIII

Poly(2,3-diphenyl-5-Hexyl-p-phenylene vinylene): (General procedure) At room temperature, at about 25° C., a 100 mL round-bottom flask was charged with monomer [5-hexyl-1,4-bis(chloromethyl)-2,3-diphenyl-benzene], acidic mono-functional additive [t-butyl benzyl chloride], and THF. The flask was evacuated with vacuum and then purged with nitrogen three times. Six equivalents of potassium t-butoxide were added dropwise into the reaction mixture. The reaction was allowed to stirred overnight at room temperature before it was poured into 300 mL of methanol. Greenish polymers were isolated by vacuum filtration, washed with methanol, and finally air-dried. Table 1 summarizes the polymerization results. The molecular weight of the polymer products can be controlled by varying the molar ratio of the monomer over the acidic mono-functional additive.

TABLE 1

Polymerization conditions and the molecular weights of poly(2,3-diphenyl-5-hexyl-p-phenylene vinylene) (DP6-PPV)

| Sample No. | Monomer/acidic additive// THF (mg/g//mL) | Molar ratio of Monomer to acidic additive | 1.0M t-BuOK in THF (mL)$^a$ | Mw/Mn ($\times 10^3$)$^b$ | PD | Yield |
| --- | --- | --- | --- | --- | --- | --- |
| I | 7.5/0.3//15 | 0.056 | 4.4 | >2000 | — | 71% |
| II | 67/0.3//15 | 0.51 | 4.4 | 1060/330 | 3.20 | 66% |
| III | 89/0.3//15 | 0.67 | 4.4 | 988/300 | 3.29 | 50% |
| IV | 133/0.3//15 | 1.00 | 4.4 | 350/110 | 3.18 | 45% |

$^a$The base was added all at once into an ice-water cooled and magnetically stirred solution of monomer/acidic additive/THF.
$^b$Relative to polystyrene in CHCl$_3$.

A 1% DP6-PPV solution in chloroform was used to spin cast a 700 Angstrom thick DP6-PPV film on an indium tin oxide (ITO) substrate followed by deposition of Mg/Ag cathode to give a single layer light-emitting diode which showed bluish green electroluminescence (EL) at 490 nm with an external EL efficiency of about 1.0 cd/A. Another 1% DP6-PPV chloroform solution containing 1% (with respect to the weight of DP6-PPV) of courmarin-6 was used to fabricate another light-emitting diode which showed green EL at 500 nm with an improved external efficiency of 2.0 cd/A.

Other modifications of the present invention may occur to one of ordinary skill in the art based upon a review of the present application and these modifications, including equivalents thereof, are intended to be included within the scope of the present invention.

What is claimed is:
1. A polymer comprised of mers or subunits selected from the group consisting of mers of the formulas:

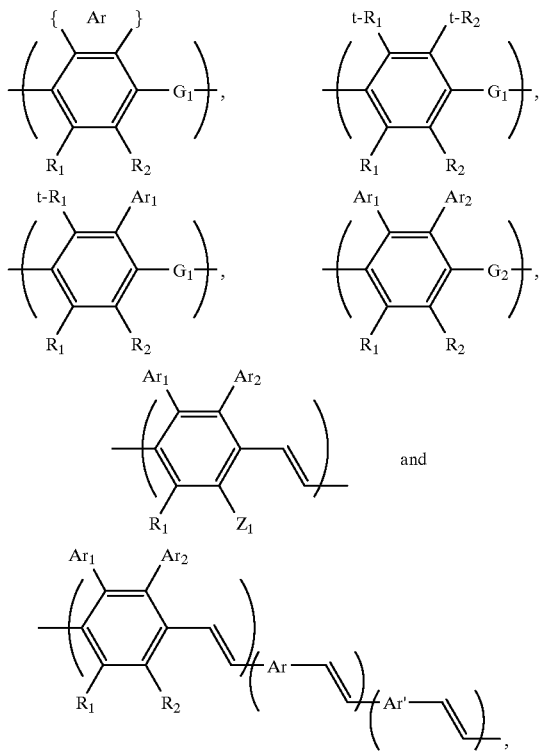

and

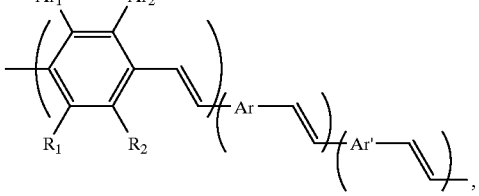

and mixtures or copolymers thereof, wherein t-$R_1$ and t-$R_2$ are tertiary and secondary alkyl groups with from 4 to about 24 carbon atoms; {Ar} is fused ring containing an aromatic or heteroaromatic group; $Ar_1$ and $Ar_2$ are substituted or unsubstituted aromatic groups with from about 6 to about 40 carbon atoms; Ar and Ar' are connecting divalent aromatic groups; $G_1$ and $G_2$ are independently selected from dicarbonyl groups, diimide groups, diether groups, and unsaturated groups, and wherein $G_2$ is other than a vinylene group; $R_1$ and $R_2$ are independently selected from hydrogen, linear or branched alkyl groups with 1 to about 24 carbon atoms, alkylthio groups, alkoxy groups, alkylseleno groups, phenoxy groups, phenylthio groups, fluoroalkyl groups with 1 to about 24 carbon atoms, siloxane groups, silane groups, alkylated aryl groups with 1 to about 24 carbon atoms, alkoxylated aryl groups with 1 to about 24 carbon atoms, color dye containing groups, ionic groups, and ion binding groups, where at least one of $R_1$ and $R_2$ are other than hydrogen; and $Z_1$ is a selected from the group consisting of silicone groups, ionic groups, and color dye containing groups.

2. A polymer in accordance with claim 1, wherein the tertiary alkyl groups, t-$R_1$ and t-$R_2$, are selected from the group consisting of t-butyl, t-octyl, 1-adamantyl, 1-bicyclo (2,2,2)octyl, and mixtures thereof.

3. A polymer in accordance with claim 1, wherein the fused ring group, {Ar}, is selected from the group consisting of the formulas:

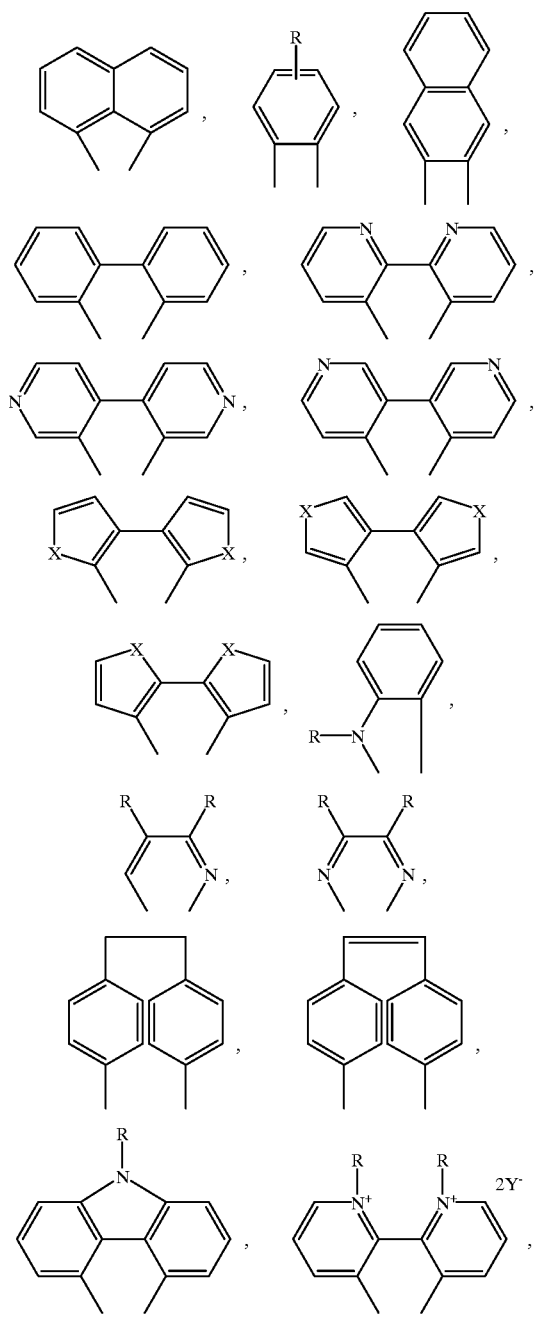

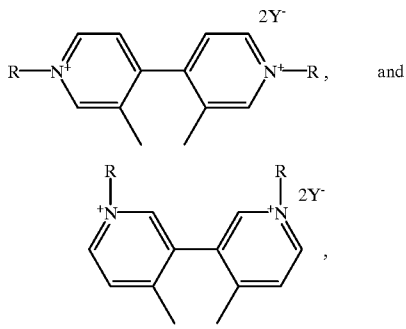

wherein X is O, S or NR' where R' is hydrogen, or an alkyl group with from 1 to about 24 carbon atoms, R is an alkyl group with 1 to about 24 carbon atoms, and $Y^-$ is a monovalent anion, selected from the group $Cl^-$, $Br^-$, $CF_3COO^-$, $BF_4^-$, $PF_6^-$, $AsF_6^-$, and $SbF_6^-$.

4. A polymer in accordance with claim 1, wherein the connecting divalent aromatic groups Ar and Ar' are independently selected from the group consisting of the formulas:

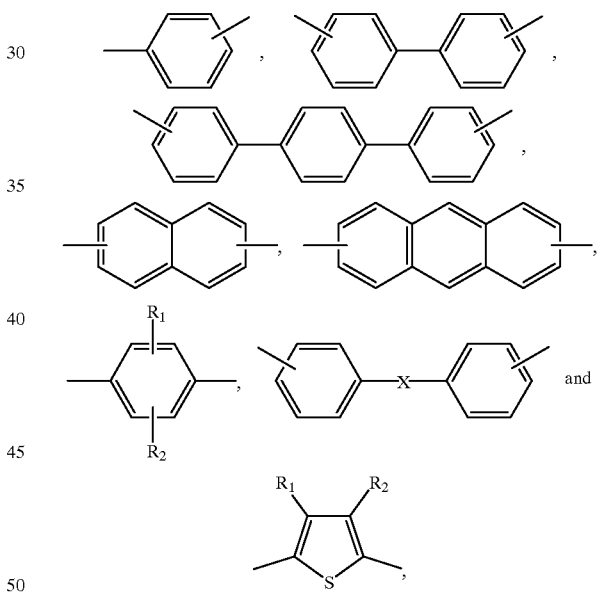

wherein $R_1$ and $R_2$ are alkyl groups with from 1 to about 24 carbon atoms, alkoxy groups with from 1 to about 24 carbon atoms, or aromatic groups with from 6 to about 24 carbon atoms, and X is O, S, or an alkylene group with from 1 to about 24 carbon atoms.

5. A polymer in accordance with claim 1, wherein the dicarbonyl groups are independently selected from the group consisting of diesters, diamides, diurethanes, diureas, dicarbonates, and diketones of the formulas:

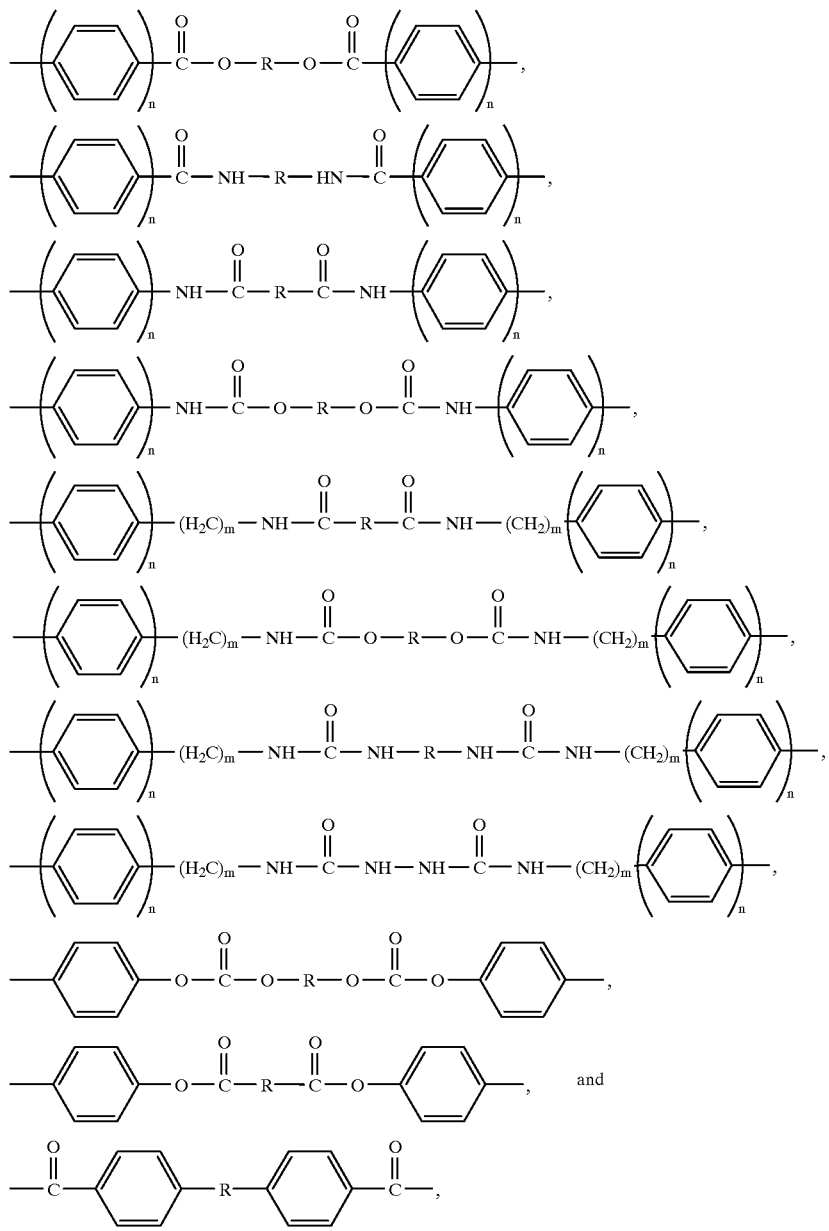
and mixtures thereof, wherein n is 0 or 1; m is 0, 1, or 2; R is an alkylene group with 2 to about 24 carbon atoms, a vinylene, an acetylene, an ethylene ether group of the formula $(CH_2CH_2O)_xCH_2CH_2$— where x is from 1 to about 10, or is an aromatic containing group selected from the group consisting of the formulas:
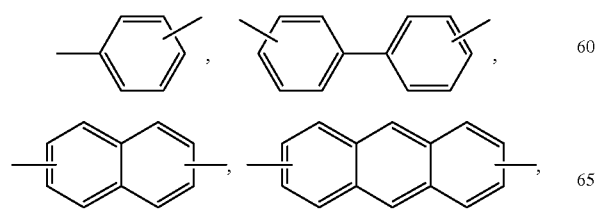
-continued
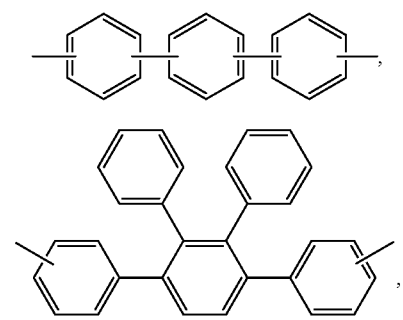

-continued
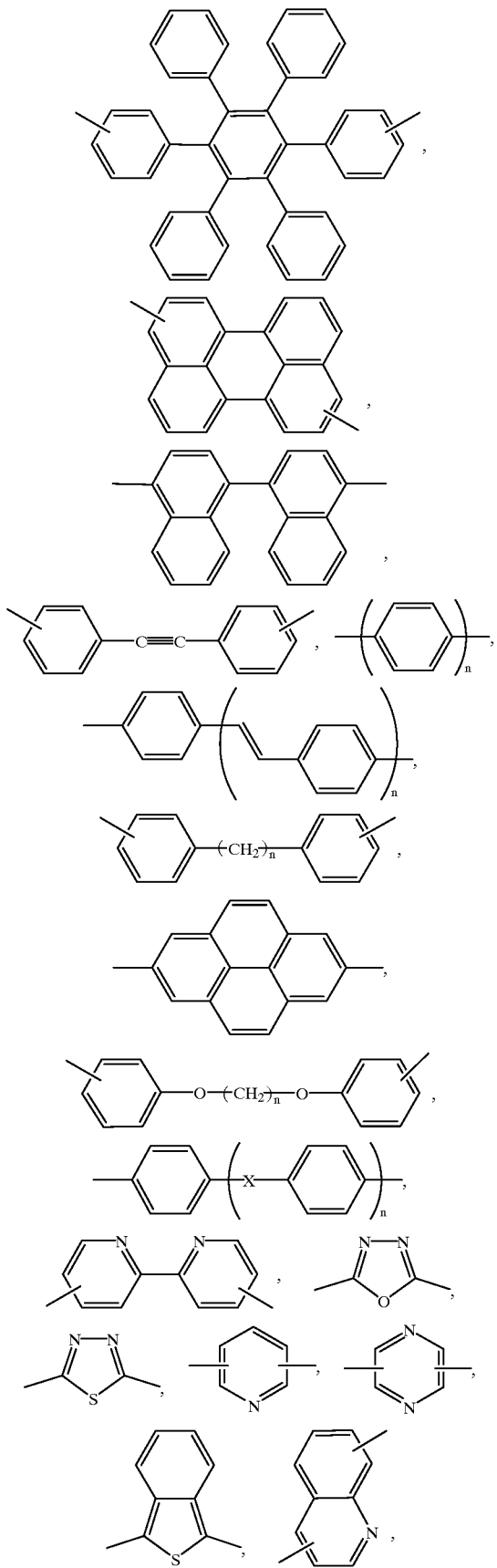
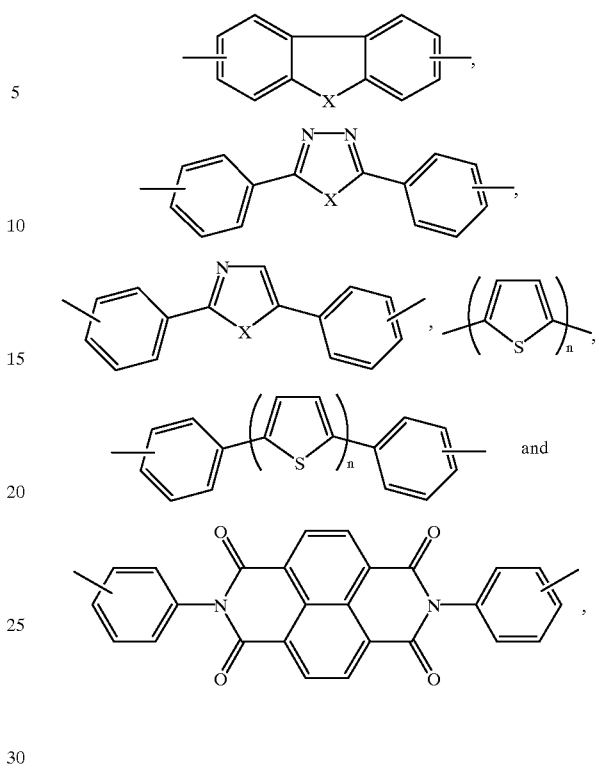
wherein n is an integer from 1 to about 12; X is O, S, Se, NH, N—CH₃, or N-Ph.
6. A polymer in accordance with claim 1, wherein the diimide groups are selected from the group consisting of the formulas:
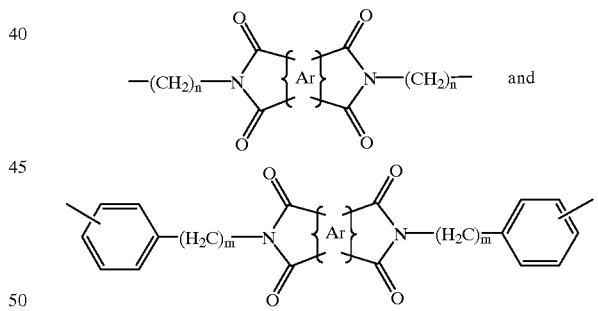
and mixtures thereof, wherein n is an integer from 0 to 1; m is an integer from 0 to 2, and {Ar} is an aromatic group selected from the group consisting of the formulas:
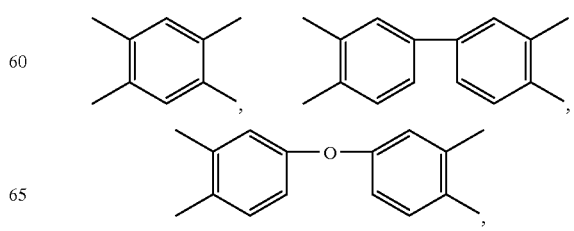

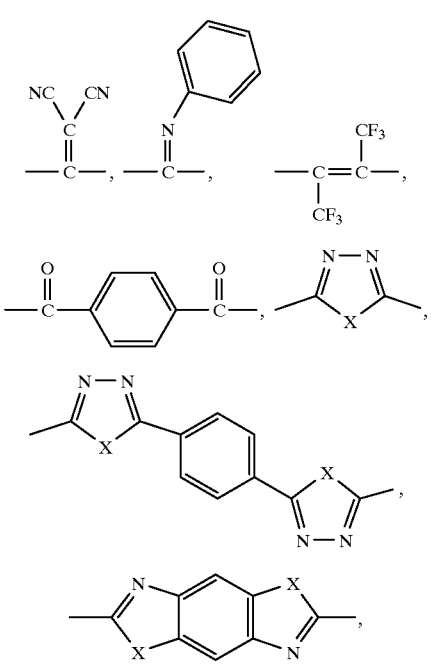
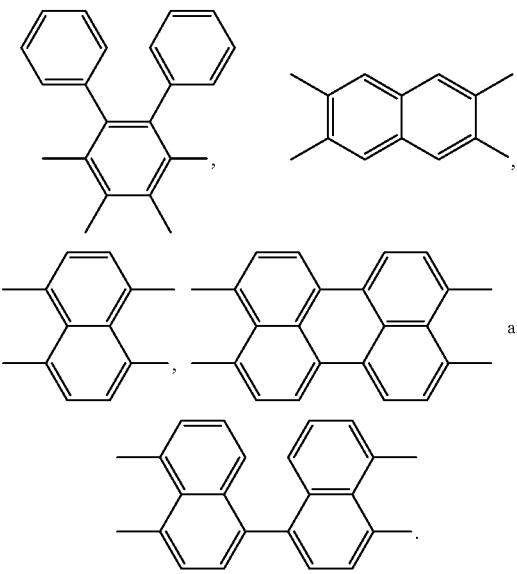
7. A polymer in accordance with claim 1, wherein the diether groups are selected from the group consisting of the formulas:
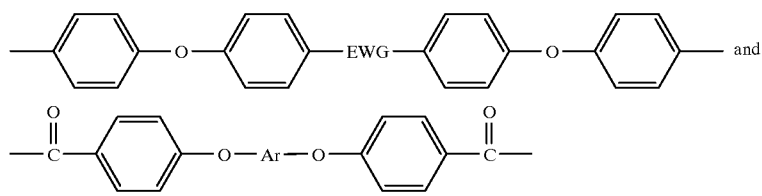
and mixtures thereof, wherein Ar is an aromatic group selected from the group consisting of the formulas:
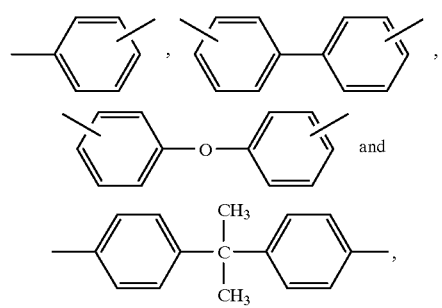
and mixtures thereof, and wherein EWG is a electron withdrawing group selected from the group consisting of the formulas:
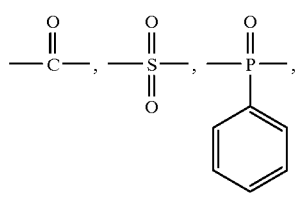
-continued
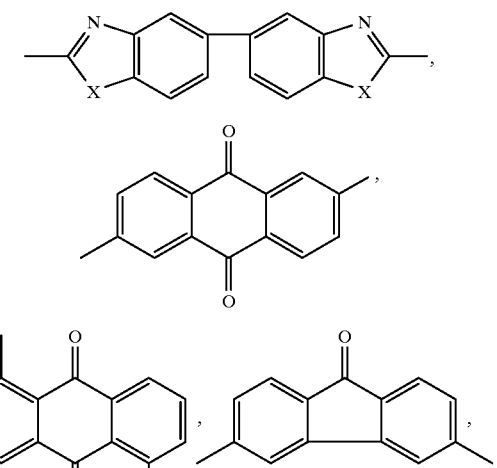
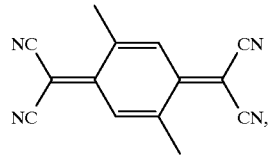

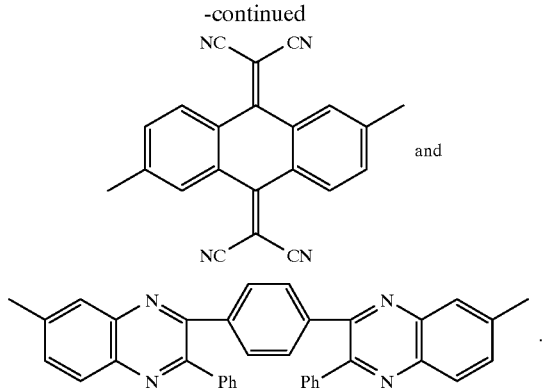

and

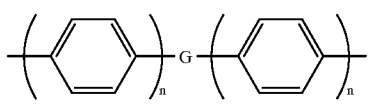

8. A polymer in accordance with claim 1, wherein the unsaturated groups are of the formulas:

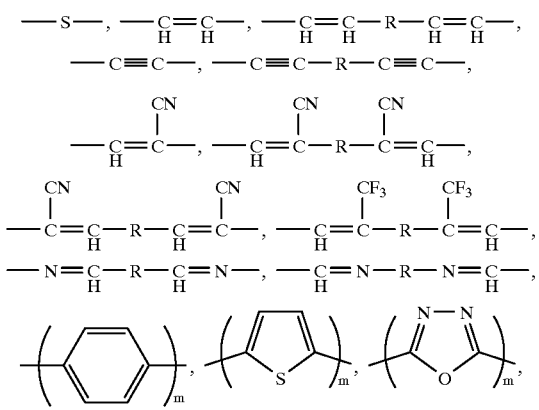

wherein n is an integer equal to 0 or 1, where n+n=1 or 2, and G is selected from the group consisting of the formulas:

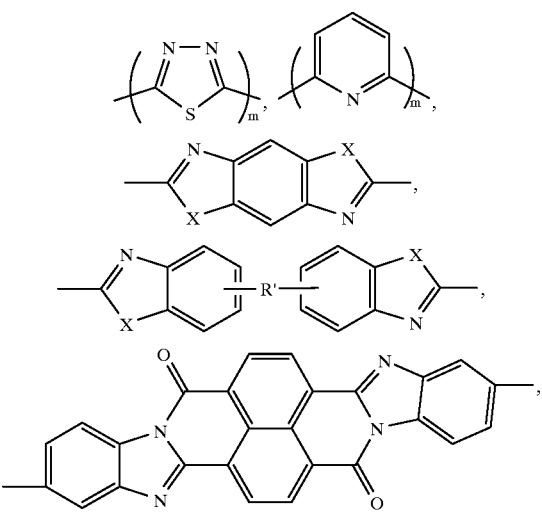

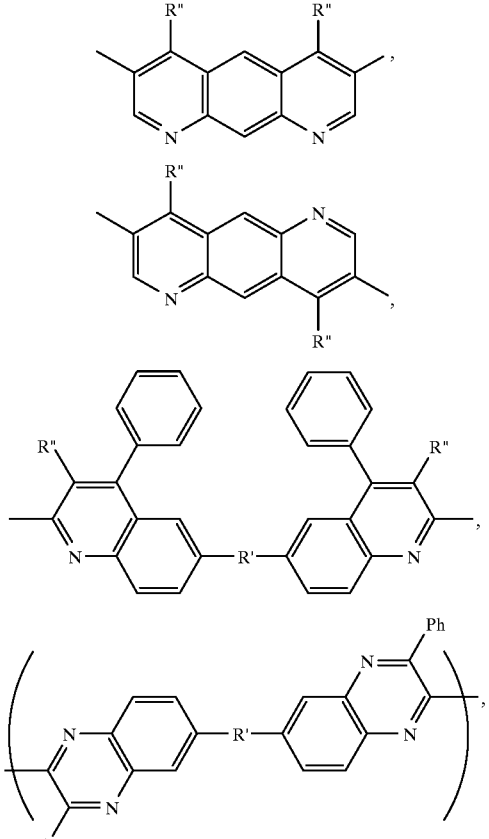

wherein m is an integer from 1 to 6, R' is nil, O, S, alkylene groups with 1 to about 12 carbon atoms, 1,2-vinylene, acetylene, 1,3-phenylene, 1,4-phenylene, or 2,2-propyl; R" is a hydrogen or phenyl group; R is an alkylene group with 2 to about 24 carbon atoms, an ethylene ether group of the formula —$(CH_2CH_2O)_xCH_2CH_2$— where x is an integer from 1 to about 10, or an aromatic group selected from group consisting of the formulas:

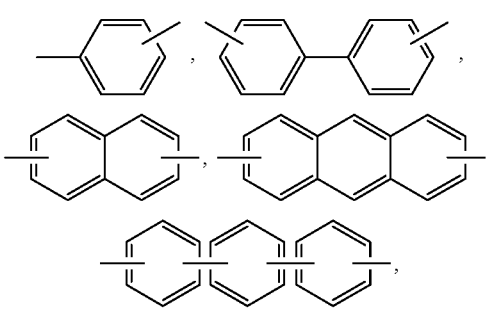

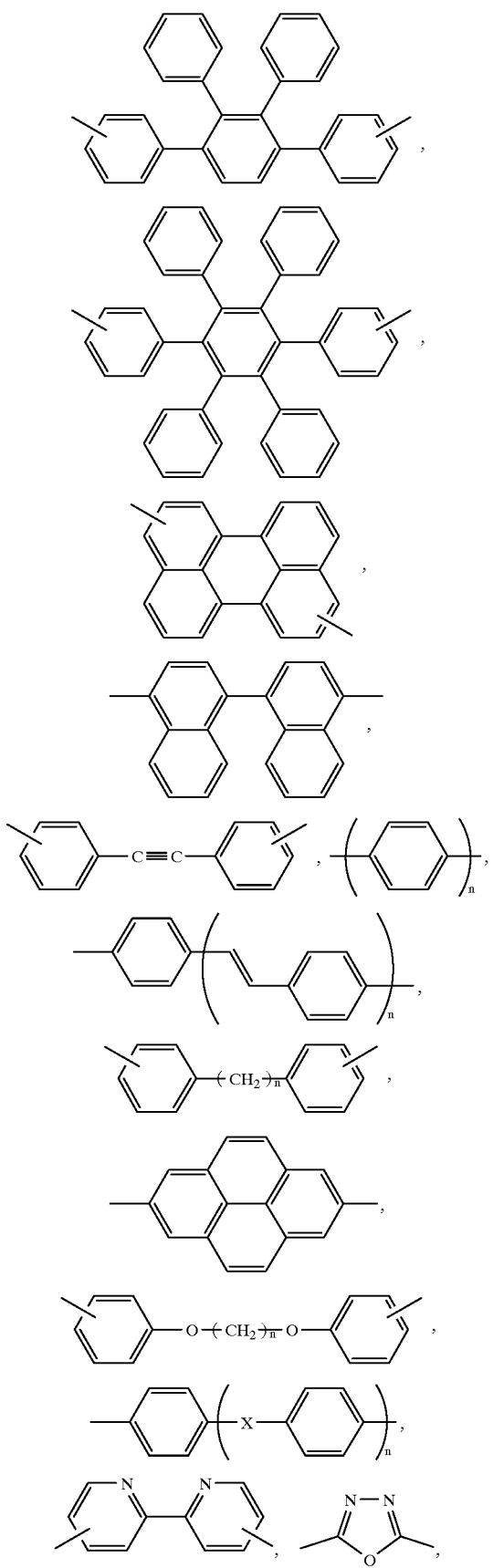

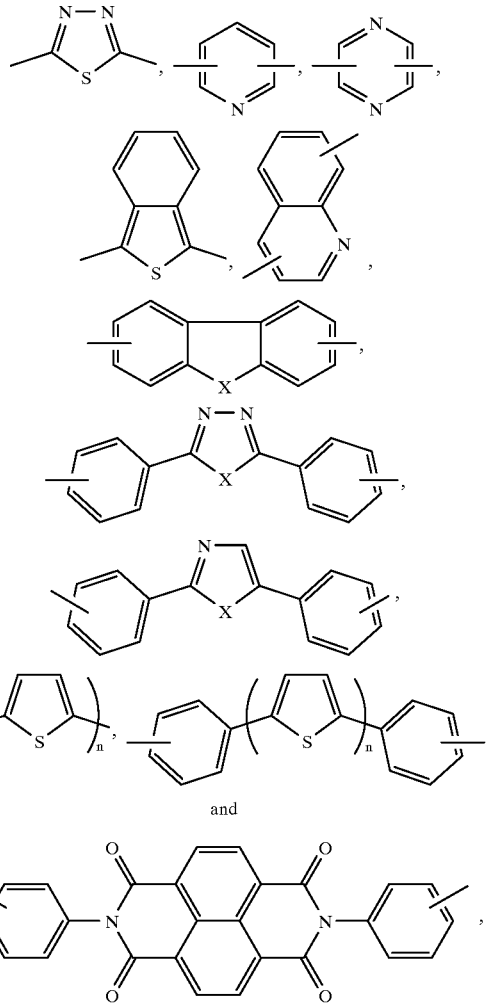

wherein n is an integer from 1 to about 12; X is O, S, Se, NH, N—CH$_3$, or N-Ph.

9. A polymer in accordance with claim 1, wherein the perfluoroalkyl groups are of the formula —(CH$_2$)$_n$(CF$_2$)$_m$F, wherein n is an integer from 0 to about 3, and m is an integer from 1 to about 16.

10. A polymer in accordance with claim 1, wherein the siloxane groups are of the formula: —(CH$_2$)$_n$[OSi(CH$_3$)$_2$]$_m$—CH$_3$, wherein n is an integer from 0 to about 10 and m is an integer from 1 to about 12.

11. A polymer in accordance with claim 1, wherein the silane groups are of the formula —Si(CH$_3$)$_2$C$_n$H$_{2n+1}$ where n is an integer from 1 to about 24.

12. A polymer in accordance with claim 1, wherein the alkylated phenyl group is of the formula:

wherein n is an integer from 3 to about 24.

13. A polymer in accordance with claim 1, wherein the alkoxylated phenyl groups are of the formula:

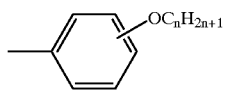

wherein n is an integer from 3 to about 24.

14. A polymer in accordance with claim 1, wherein the color dye containing groups are selected from the group consisting of the formulas:

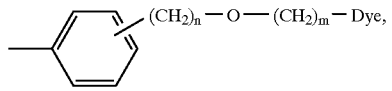

wherein n and m are integers from 0 to about 10, and Dye is selected from the group consisting of the formulas:

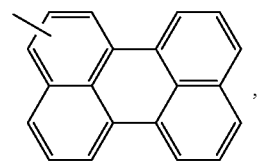

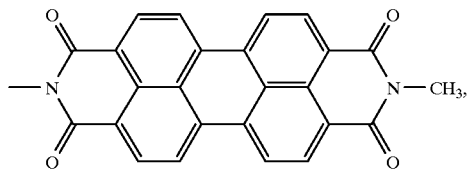

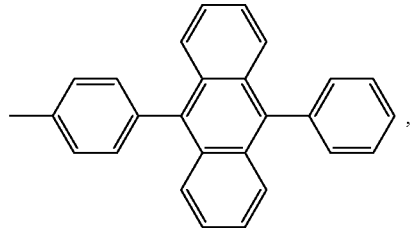

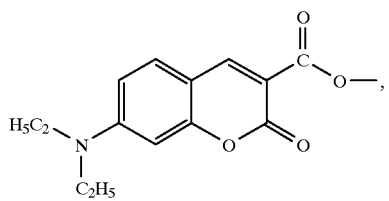

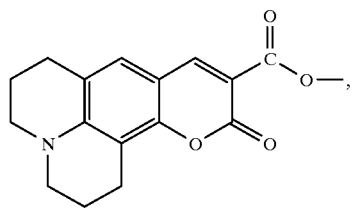

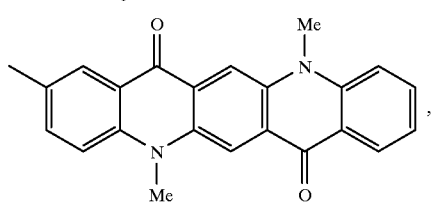

-continued

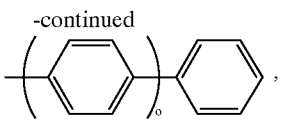

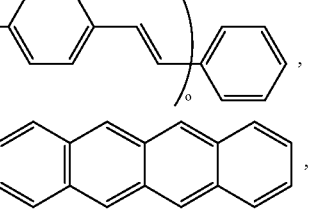

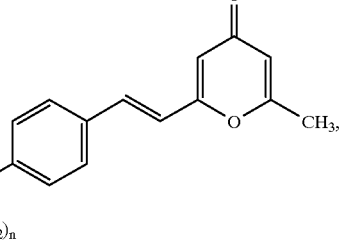

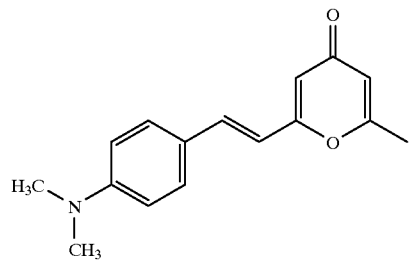

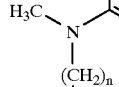

and

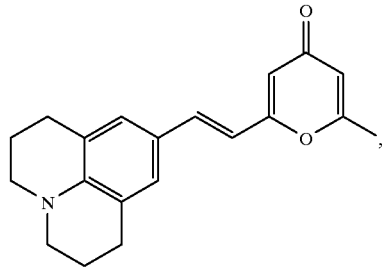

and mixtures thereof, wherein o is an integer from 2 to about 5.

15. A polymer in accordance with claim 1, wherein the ionic groups are ionizable and hydrophilic and are selected from the group consisting of carboxylic acids, metal carboxylates, sulfonic acids, metal sulfonates, quaternary ammonium ions, pyridinium ions, mercaptan groups, alcohol groups, and mixtures thereof.

16. A polymer in accordance with claim 1, wherein the ion binding groups are hydrophilic and are selected from the group consisting of oligo alkylene oxides, 2,2'-bipyridine, crown ethers, porphyrins, calixarenes, 8-hydroxyquinoline compounds, 2-hydroxyquinoline compounds, cyclodextrins, catenanes, rotaxanes, and mixtures thereof.

17. A polymer in accordance with claim 1, wherein the mers are selected from the group consisting of the formulas:

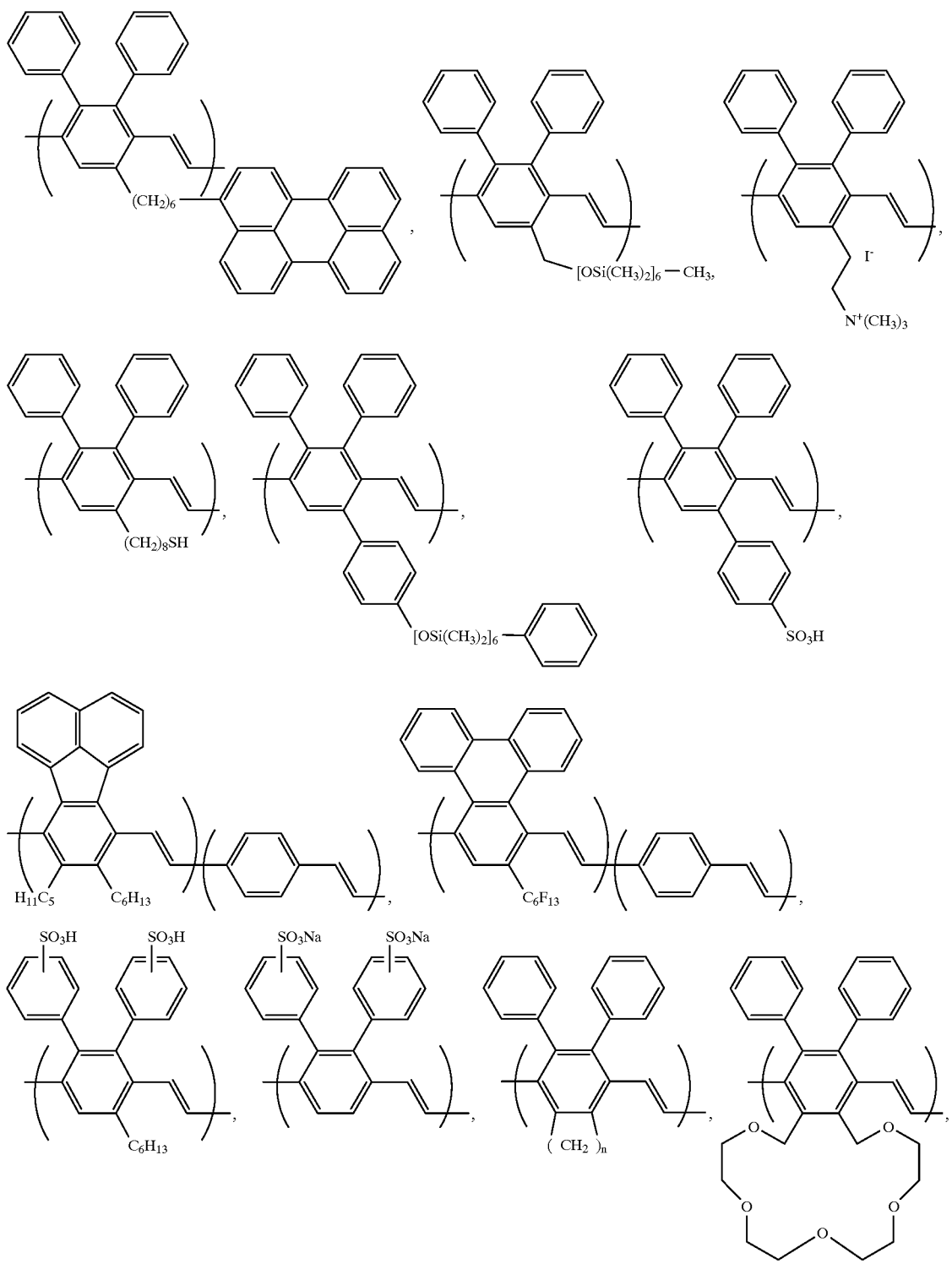

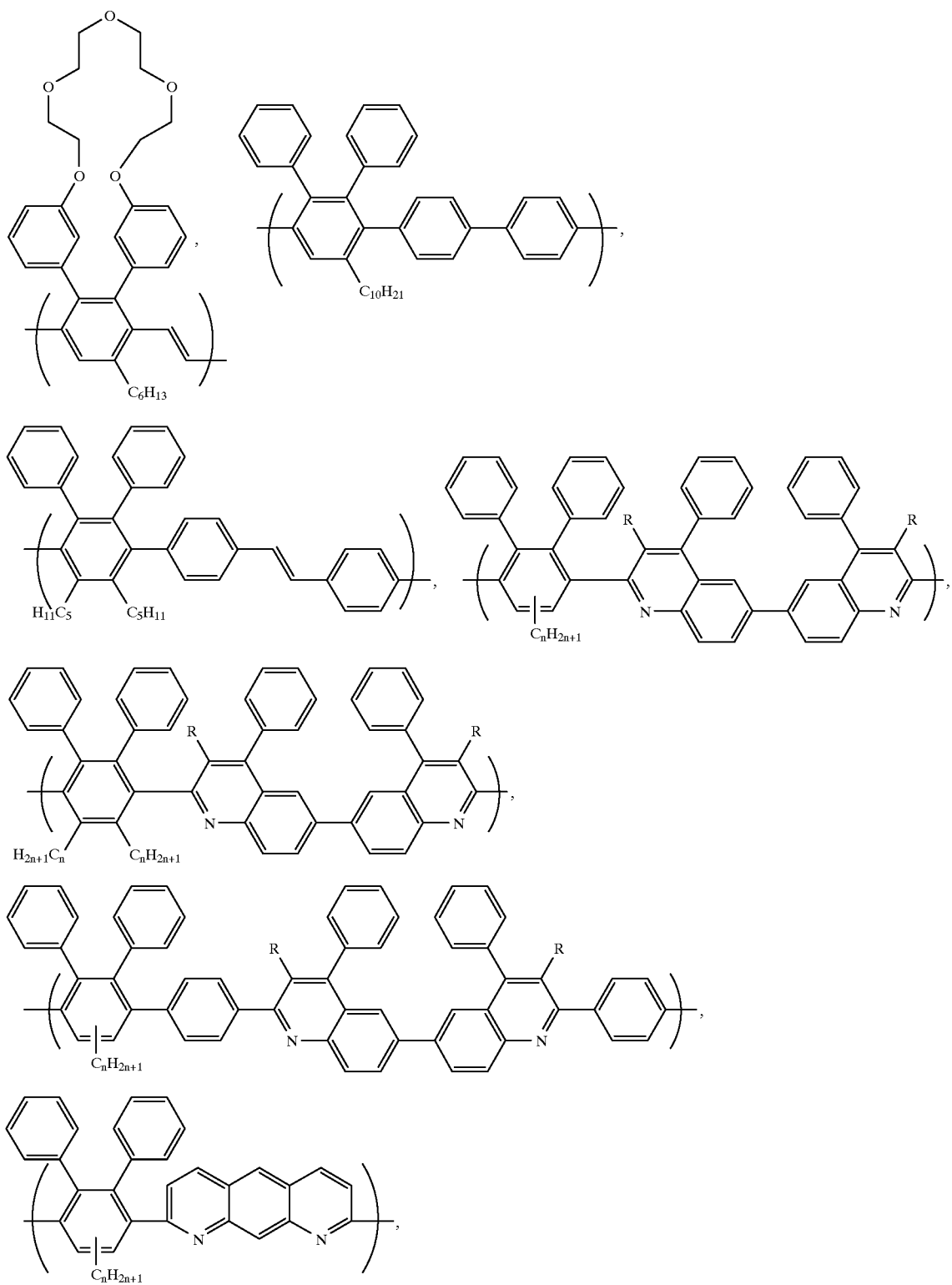

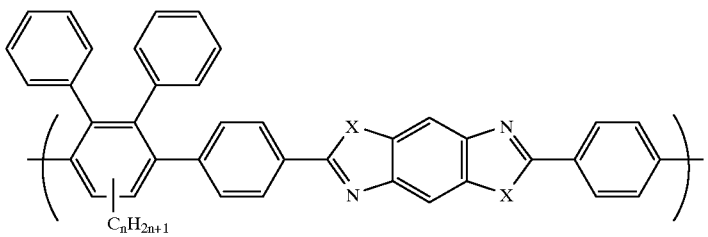

and

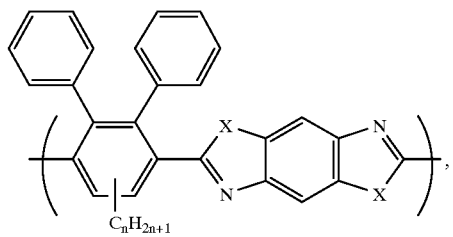, and mixtures thereof, wherein n is an integer from 3 to about 24; R is hydrogen or a phenyl group; and X is O or S.

18. A polymer in accordance with claim 1, wherein said polymer or copolymer has a weight average molecular weight from about 5,000 to about 2,000,000, a number average molecular weight of from about 500 to about 200,000, and wherein the polymer or copolymer is soluble in organic solvents.

19. An electroluminescent device comprised of an anode, a metal oxide, a charge transport layer, a charge injecting layer, an electron injecting layer, a electron transport layer, and a cathode, and wherein the charge transport layer contains a single layer or multilayer comprised of at least one of the polymers or copolymers of claim 1.

20. An electroluminescent device in accordance with claim 19, further comprising a dopant in the polymer wherein said dopant is selected from the group consisting of electron transport molecules, hole transport molecules, a charge transport compound and oxidized salts thereof, ionizable salts of ionomers and ionophores, an oxidant, light emitting compounds, and mixtures thereof.

* * * * *